United States Patent
Takaki et al.

(10) Patent No.: US 9,419,058 B1
(45) Date of Patent: Aug. 16, 2016

(54) MEMORY DEVICE WITH COMB-SHAPED ELECTRODE HAVING A PLURALITY OF ELECTRODE FINGERS AND METHOD OF MAKING THEREOF

(71) Applicant: SanDisk Technologies, Inc., Plano, TX (US)

(72) Inventors: Seje Takaki, Yokkaichi (JP); Yoshihiro Sato, Nagoya (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/614,709

(22) Filed: Feb. 5, 2015

(51) Int. Cl.
*H01L 27/115* (2006.01)
*H01L 27/24* (2006.01)
*H01L 45/00* (2006.01)

(52) U.S. Cl.
CPC .......... *H01L 27/249* (2013.01); *H01L 27/2436* (2013.01); *H01L 27/2454* (2013.01); *H01L 45/16* (2013.01)

(58) Field of Classification Search
CPC .............. H01L 27/249; H01L 27/2454; H01L 27/2436; H01L 45/16
See application file for complete search history.

(56) References Cited

U.S. PATENT DOCUMENTS

| | | | |
|---|---|---|---|
| 5,915,167 A | 6/1999 | Leedy | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,846,782 B2 | 12/2010 | Maxwell et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,932 B2 | 5/2012 | Nguyen et al. | |
| 8,394,716 B2 | 3/2013 | Hwang et al. | |
| 8,427,859 B2 | 4/2013 | Sandhu et al. | |
| 8,520,425 B2 | 8/2013 | Xiao et al. | |
| 8,619,453 B2 * | 12/2013 | Scheuerlein | ....... G11C 13/0002 365/130 |

(Continued)

FOREIGN PATENT DOCUMENTS

| KR | 20100109745 A | 10/2010 |
|---|---|---|
| KR | 20110021444 A | 3/2011 |

(Continued)

OTHER PUBLICATIONS

U.S. Appl. No. 14/136,103, filed Dec. 20, 2013, Takaki.

(Continued)

*Primary Examiner* — Thomas L Dickey
*Assistant Examiner* — Damon Hillman
(74) *Attorney, Agent, or Firm* — The Marbury Law Group PLLC

(57) ABSTRACT

A memory device, such as a ReRAM device includes plural interdigitated word lines and a single select transistor controlling plural vertical local bit lines. The interdigitated word lines may be word line combs containing word line fingers which are electrically connected using contact pads and a sidewall bridge interconnect. The select transistor may be a vertical TFT or a planar field effect transistor.

30 Claims, 28 Drawing Sheets

(56) References Cited

U.S. PATENT DOCUMENTS

| | | |
|---|---|---|
| 2003/0062574 A1 | 4/2003 | Hsieh |
| 2004/0042298 A1 | 3/2004 | Hideki |
| 2007/0210338 A1 | 9/2007 | Orlowski |
| 2007/0252201 A1 | 11/2007 | Kito et al. |
| 2009/0001344 A1 | 1/2009 | Schricker et al. |
| 2009/0230449 A1 | 9/2009 | Sakaguchi et al. |
| 2009/0230512 A1 | 9/2009 | Baek et al. |
| 2010/0013049 A1 | 1/2010 | Tanaka et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0121403 A1 | 5/2011 | Lee et al. |
| 2011/0133606 A1 | 6/2011 | Yoshida et al. |
| 2011/0151667 A1 | 6/2011 | Hwang et al. |
| 2011/0169071 A1 | 7/2011 | Uenaka |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0147648 A1 | 6/2012 | Scheuerlein |
| 2013/0210211 A1 | 8/2013 | Vereen et al. |
| 2013/0264631 A1 | 10/2013 | Alsmeier et al. |
| 2013/0308363 A1 | 11/2013 | Scheuerlein et al. |
| 2013/0313627 A1 | 11/2013 | Lee |
| 2013/0336037 A1 | 12/2013 | Chen et al. |
| 2015/0263069 A1* | 9/2015 | Jo .................. H01L 45/00 365/148 |
| 2015/0294977 A1* | 10/2015 | Kim .............. H01L 27/11573 257/314 |

FOREIGN PATENT DOCUMENTS

| | | |
|---|---|---|
| KR | 20140008704 A | 1/2014 |
| WO | WO 02/15277 A2 | 2/2002 |

OTHER PUBLICATIONS

U.S. Appl. No. 14/206,196, filed Mar. 12, 2014, Takaki.
U.S. Appl. No. 14/150,162, filed Jan. 8, 2014, Takaki et al.
U.S. Appl. No. 14/224,290, filed Mar. 25, 2014, Takaki.
U.S. Appl. No. 14/643,211, filed Mar. 10, 2015, Tobitsuka.
Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level- Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked IG Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
International Search Report and Written Opinion of the International Searching Authority for PCT/US2015/062545, fated Feb. 23, 2016, 21 pages.

* cited by examiner

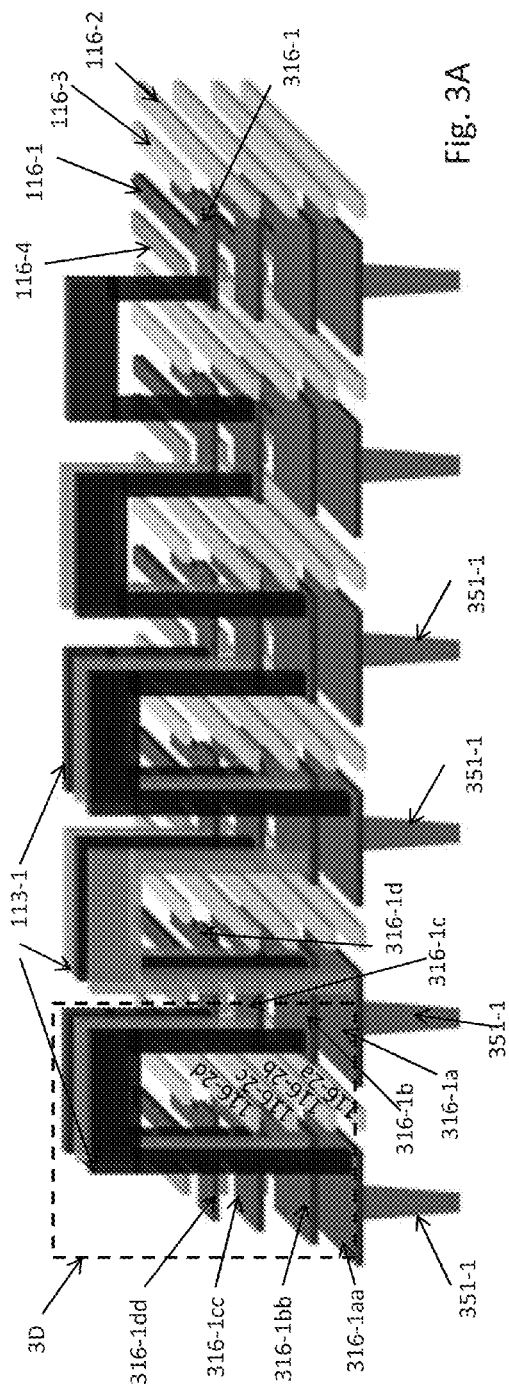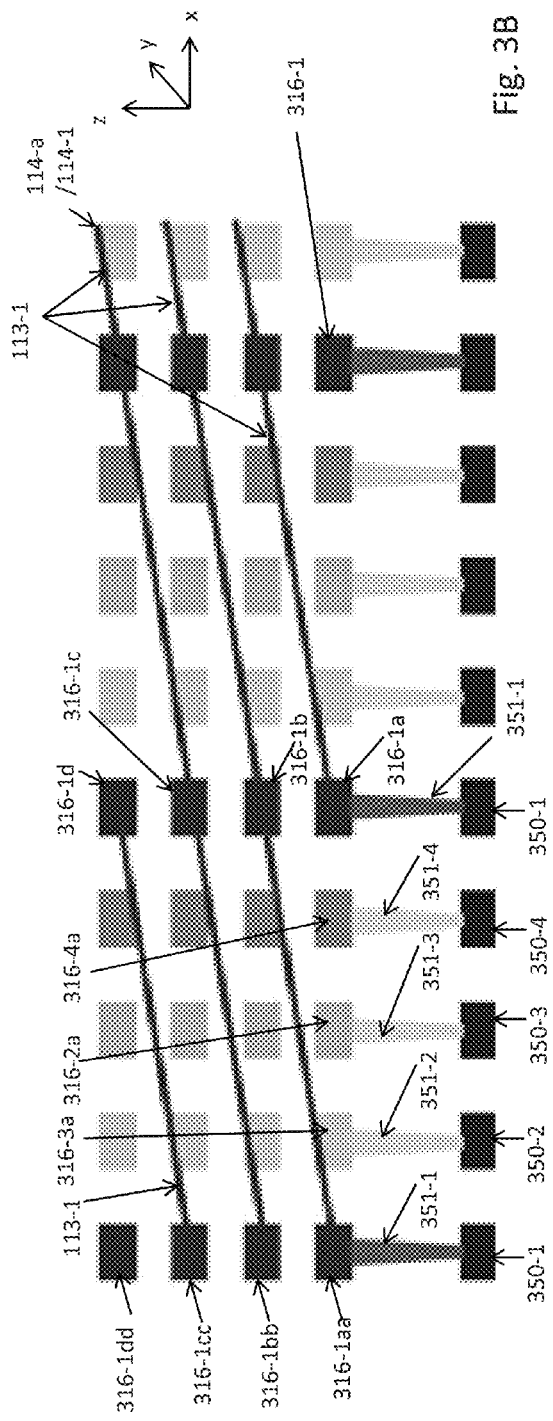

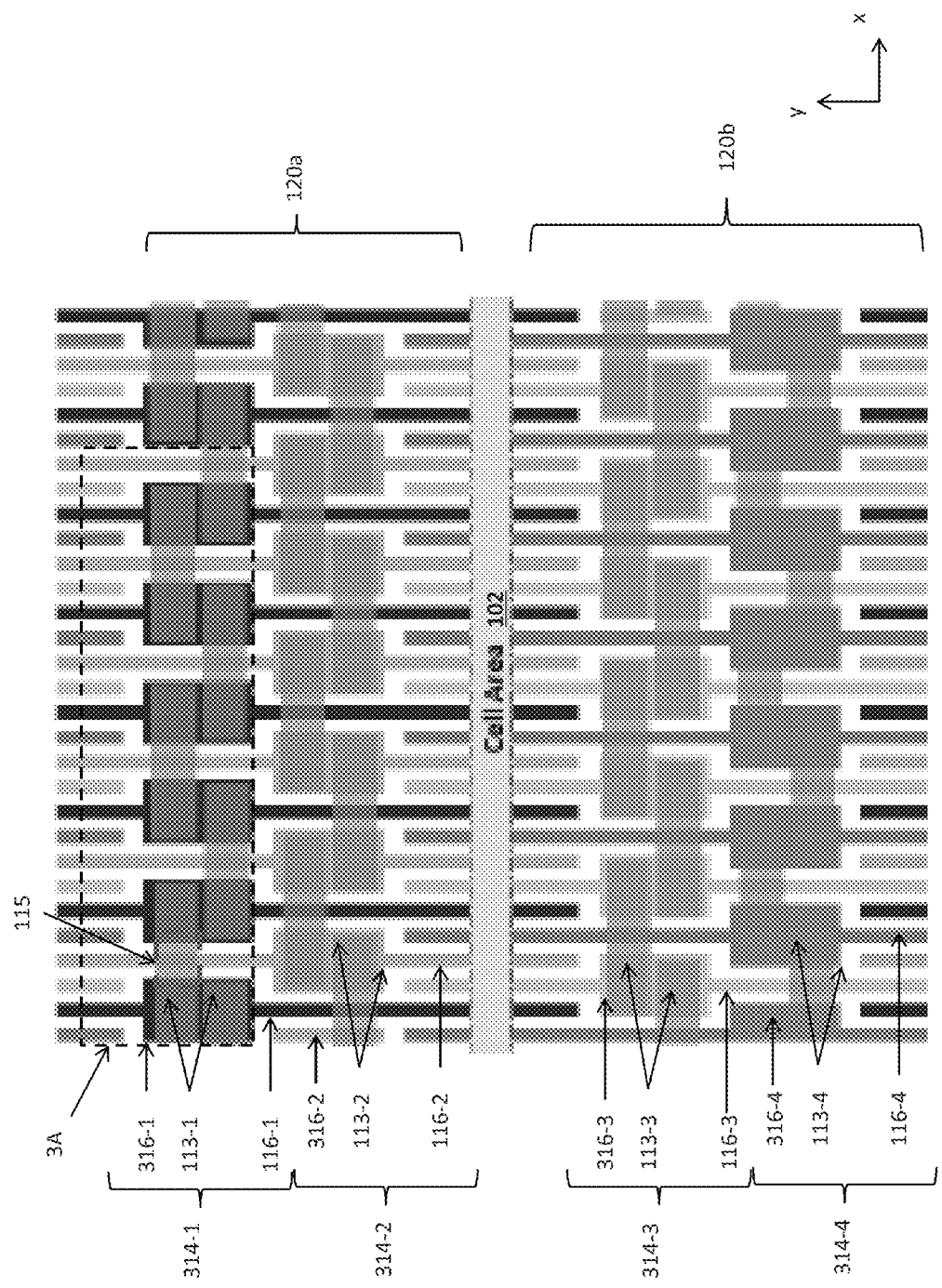

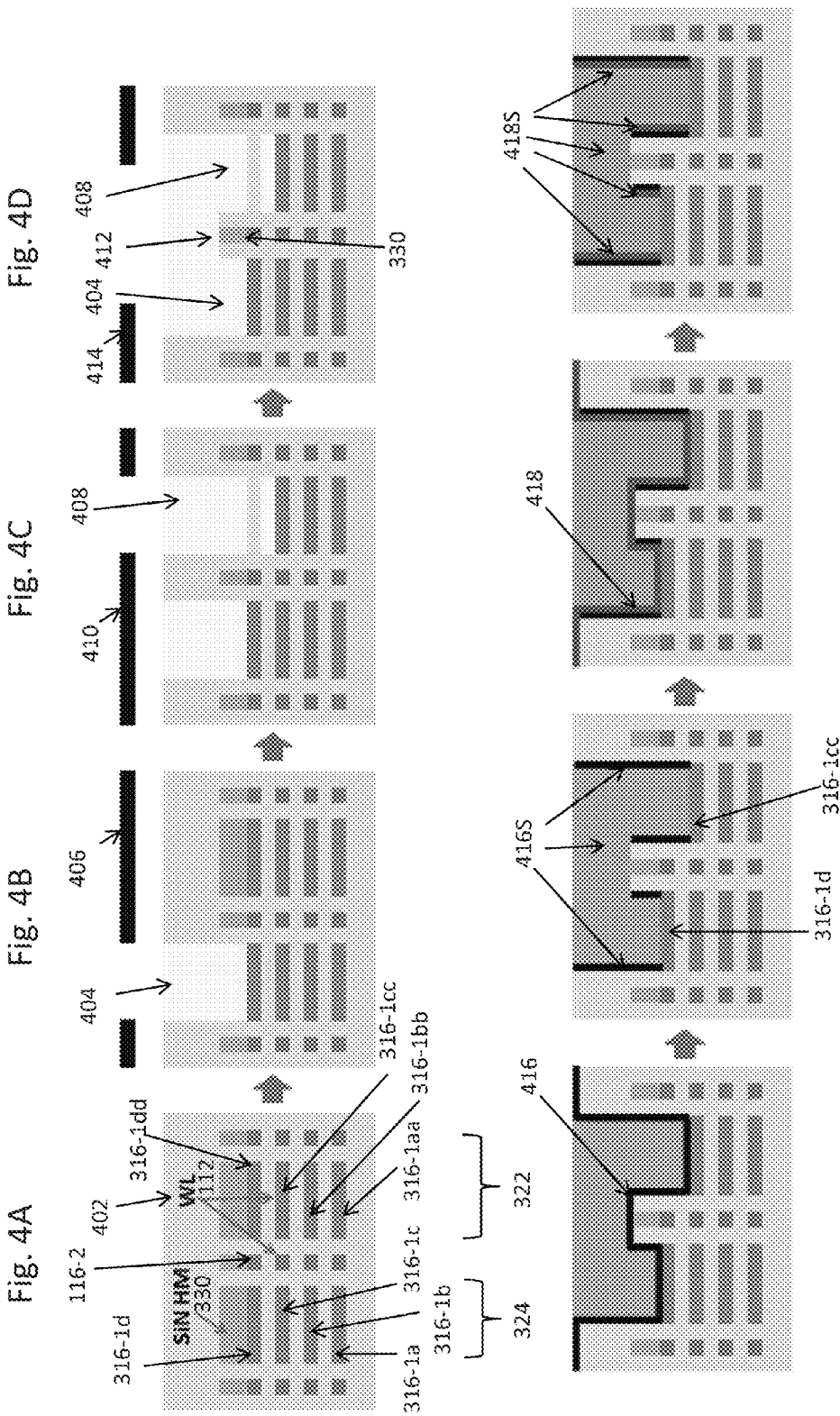

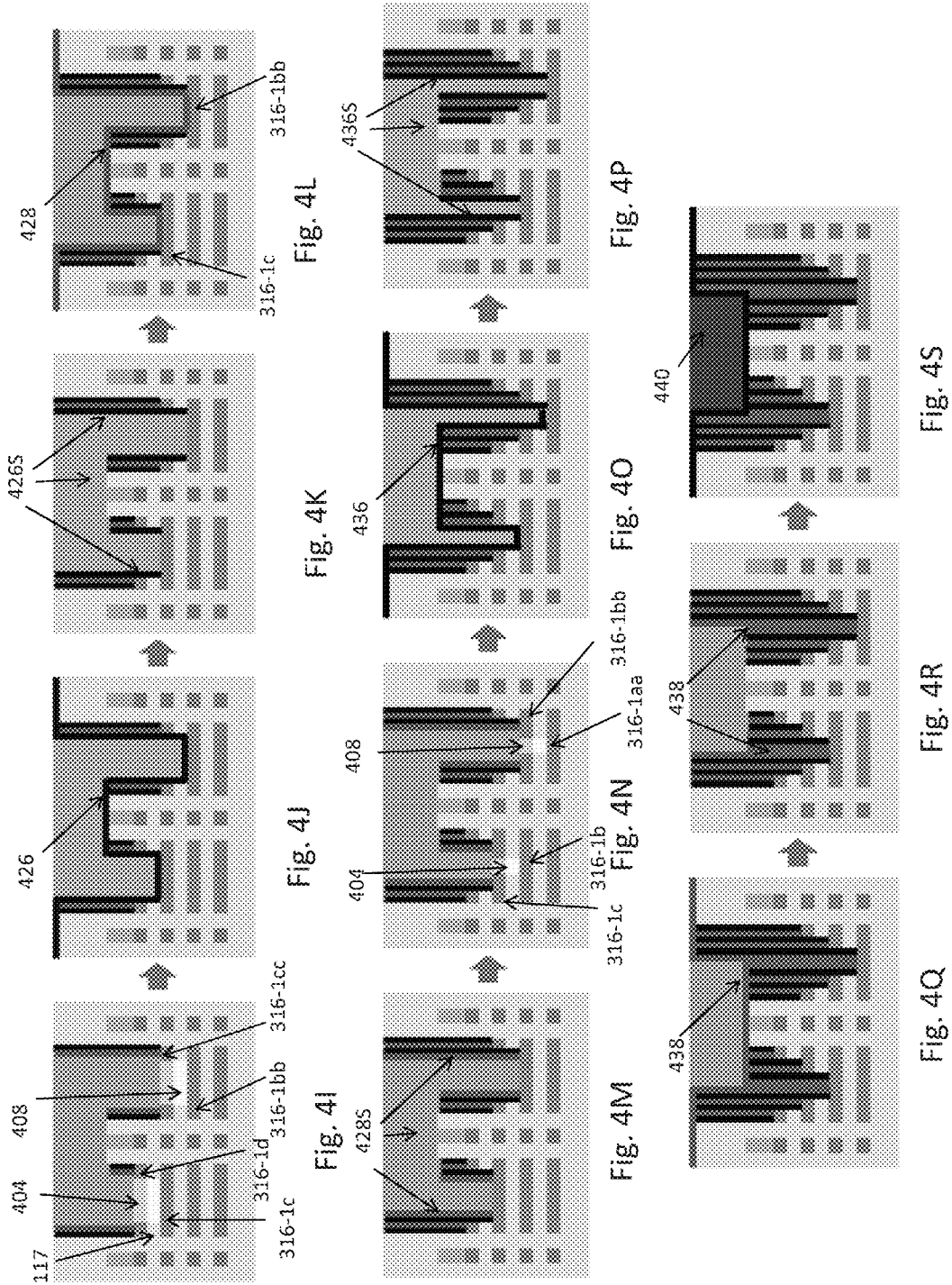

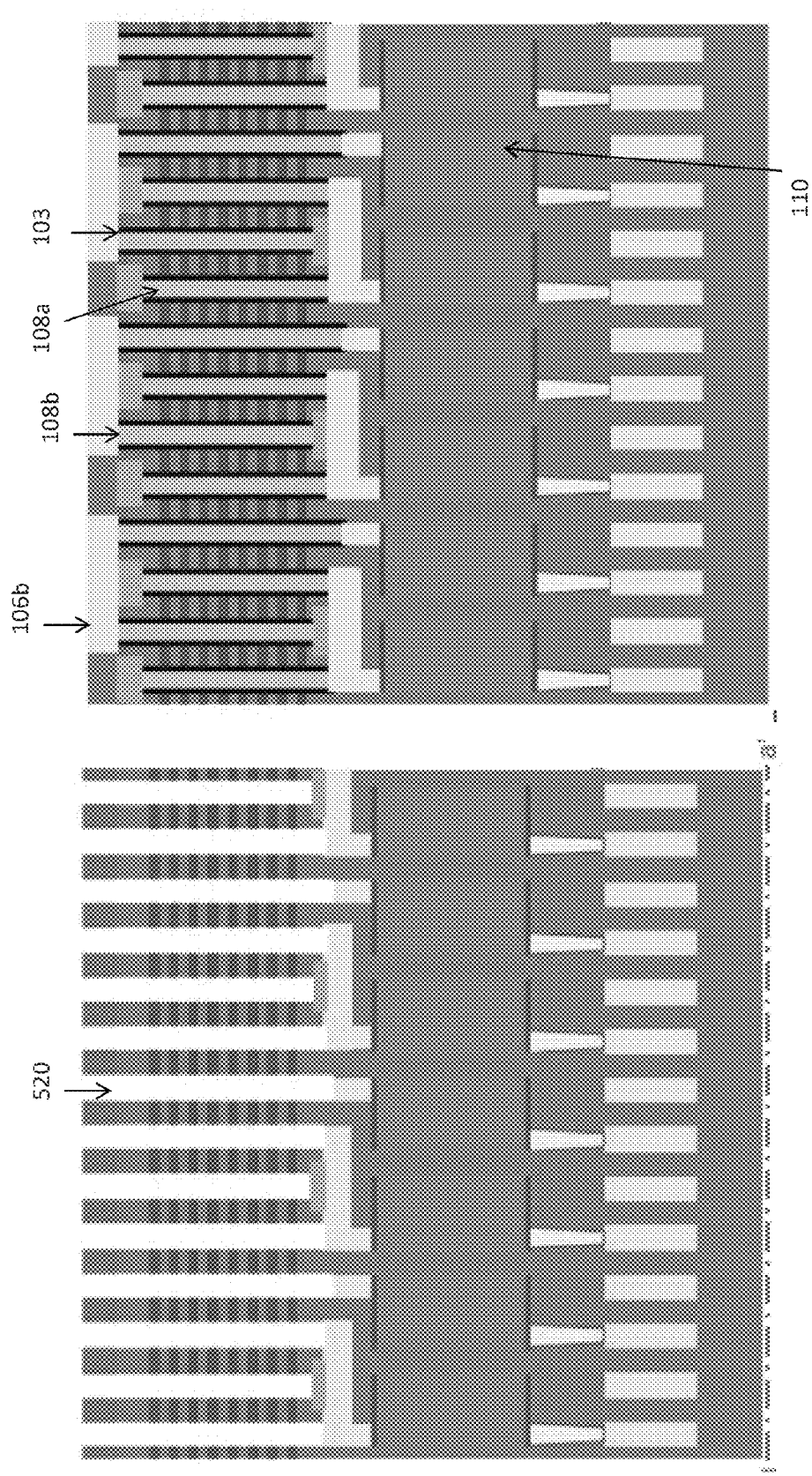

MEMORY DEVICE WITH COMB-SHAPED ELECTRODE HAVING A PLURALITY OF ELECTRODE FINGERS AND METHOD OF MAKING THEREOF

FIELD

The present description relates generally to the field of semiconductor devices and specifically to three dimensional memory devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344 A1, which is incorporated herein by reference in its entirety. U.S. Patent Application Publication No. 2012/0147648 A1, published Jun. 14, 2012 and incorporated by reference herein in its entirety, describes a three dimensional resistive RAM ("ReRAM") device containing non-volatile memory element ("NVM") material that is non-conductive when first deposited. Since the material is initially non-conductive, there is no necessity to isolate the memory elements at the cross-points of the word and bit lines from each other. Several memory elements may be implemented by a single continuous layer of material, which may be strips of NVM material oriented vertically along opposite sides of the vertical bit lines in the horizontal and extending upwards through all the planes in the vertical direction.

SUMMARY

One embodiment relates to a memory device, including: a first bit line interconnect; a second bit line interconnect; a first plurality of electrically conductive local bit lines extending in a substantially vertical direction into a memory cell region, wherein each local bit line in the first plurality of electrically conductive local bit lines is electrically connected to the first bit line interconnect; a second plurality of electrically conductive local bit lines extending in the substantially vertical direction into the memory cell region and horizontally offset from the first plurality of electrically conductive local bit lines, wherein each local bit line in the second plurality of electrically conductive local bit lines is electrically connected to the second bit line interconnect; a first select transistor electrically connected to the first bit line interconnect, wherein the first select transistor is configured to select the first plurality of electrically conductive local bit lines; a second select transistor electrically connected to the second bit line interconnect, wherein the second select transistor is configured to select the second plurality of electrically conductive local bit lines; a plurality of word lines extending in a substantially horizontal direction into the memory cell region; and a plurality of memory cells located in the memory cell region.

In another embodiment, a memory device is disclosed, including: a memory cell region; a plurality of memory cells located in the memory cell region; a plurality of word lines extending in a substantially horizontal direction into the memory cell region; and a plurality of bit lines extending in a substantially vertical direction into the memory cell region. In some embodiments, the plurality of word lines include a first, second, third and forth word line comb; each word line comb includes a plurality of electrically conductive fingers; the plurality of electrically conductive fingers for each word line comb electrically contact other electrically conductive fingers of the same word line comb and are electrically insulated from the electrically conductive fingers of the other word line combs; the fingers of the first and second word line combs extend in a first substantially horizontal direction from a first interconnect region into a first side of the memory cell region; the fingers of the third and forth word line combs extend in a second substantially horizontal direction from a second interconnect region into a second side of the memory cell region opposite to the first side of the memory cell region; and the fingers of the first, second, third and forth word line comb are alternately interdigitated in the memory cell region.

In another embodiment, a method is disclosed of making an interconnect between electrodes in a three dimensional device, the method including: providing a first stack of electrodes including a first electrode located in a first device level, a second electrode located in a second device level above the first device level, a third electrode located in a third device level above the second device level, and a fourth electrode located in a fourth device level above the third device level; providing a second stack of electrodes which is offset in a substantially horizontal direction from the first stack of electrodes, the second stack of electrodes including a first electrode located in the first device level, a second electrode located in the second device level above the first device level, a third electrode located in the third device level above the second device level, and a fourth electrode located in the fourth device level above the third device level; forming an insulating fill layer over the first and the second stacks of electrodes forming a first opening to the fourth electrode in the first stack of electrodes through the insulating fill layer; forming a second opening through the insulating fill layer and through the fourth electrode to the third electrode in the second stack of electrodes; forming a first insulating layer in the first and the second openings such that the first insulating layer is located on sidewalls of the first and the second openings and such that the fourth electrode is exposed in the first opening and the third electrode is exposed in the second opening; forming a first conductive layer in the first and the second openings such that the first conductive layer is located on the first insulating layer over the sidewalls of the first and second openings and such that the first conductive layer electrically contacts and connects the fourth electrode exposed in the first opening and the third electrode exposed in the second opening; extending the first opening through the fourth electrode to expose the third electrode in the first electrode stack without removing the first conductive layer from over the sidewalls of the first opening; extending the second opening through the third electrode to expose the second electrode in the second electrode stack without removing the first conductive layer from over the sidewalls of the second opening; forming a second insulating layer in the first and the second openings such that the second insulating layer is located on sidewalls of the first and the second openings and such that the third electrode is exposed in the first opening and the second electrode is exposed in the second opening; forming a second conductive layer in the first and the second openings such that the second conductive layer is located on the second insulating layer over the sidewalls of the first and second openings and such that the second conductive layer electrically contacts and connects the third electrode exposed in the first opening and the second electrode exposed in the second opening; extending the first opening through the third electrode to expose the second electrode in the first electrode stack without removing the second conductive layer from over the sidewalls of the first opening; extending the second opening through the second electrode to expose the first electrode in the second electrode stack without removing the second conductive layer from over the sidewalls of the second opening; forming a third insulating layer in the first and the second openings such that the third insulating layer is located on sidewalls of the first and the second openings and such that the second electrode is exposed in the first opening and the first electrode is exposed in the second opening; and forming a third conductive layer in the first and the second openings such that the third conductive layer is located on the third insulating layer over the sidewalls of the first and second openings and such that the third conductive layer electrically contacts and connects the second electrode exposed in the first opening and the first electrode exposed in the second opening.

In another embodiment, a method of making a contact to a semiconductor device is disclosed, the method including: forming a conductive layer over a semiconductor layer; forming a first mask pattern over the conductive layer; etching portions of the conductive layer and the semiconductor layer exposed in the first mask pattern to form a plurality of pillars, wherein each pillar includes a lower semiconductor region and an upper conductive region; forming an insulating fill layer between the plurality of pillars; forming a second mask pattern over the plurality of pillars and the insulating fill layer, wherein the second mask pattern is offset with respect to the first mask pattern such that the second mask pattern covers both adjacent first edge portions of the upper conductive region in each adjacent pair of the plurality of pillars and the insulating fill layer between each adjacent pair of the plurality of pillars, while leaving opposing second edge portions of the upper conductive region in each pair of the plurality of pillars uncovered; etching the second edge portions of the upper conductive regions of each pair of the plurality of pillars to leave a plurality of upper contacts including the first edge portions of the upper conductive regions, wherein each of the plurality of upper contacts is located on the respective lower semiconductor region in each of the plurality of pillars.

In another embodiment, a semiconductor device is disclosed, including: a first, second, third and fourth transistors, each transistor having a channel region of a second conductivity type located in a horizontal plane between source region and first drain region of a first conductivity type, wherein: the second transistor is located adjacent to the first transistor in a first horizontal direction in the horizontal plane, such that a first channel edge containing the source region of the first transistor faces a second channel edge containing the source region of the second transistor; the third transistor is located adjacent to the first transistor in a second horizontal direction in the horizontal plane, such that a third channel edge containing the first drain region of the first transistor faces a fourth channel edge containing the first drain region of the third transistor; the fourth transistor is located adjacent to the second transistor in the second horizontal direction in the horizontal plane, such that a third channel edge containing the first drain region of the second transistor faces a fourth channel edge containing the first drain region of the fourth transistor; the fourth transistor is located adjacent to adjacent to the third transistor in the first horizontal direction in the horizontal plane, such that a first channel edge containing the source region of the third transistor faces a second channel edge containing the source region of the fourth transistor; the first channel edge of each transistor is located opposite the second channel edge of each transistor; the third channel edge of each transistor is located opposite the fourth channel edge of each transistor; the second horizontal direction is substantially perpendicular to the first horizontal direction; and the source region of each transistor is offset in both the first and the second directions with respect to the first drain region of each transistor. The device may also include: a common source line which extends in the second direction between the first and the second transistors and between the third and the fourth transistors, and which is electrically connected to the source regions of each of the first, second, third and fourth transistors; a first common gate electrode which extends in the first direction over the channel regions between respective source regions and first drain regions of the first and the second transistors; and a second common gate electrode which extends in the first direction over the channel regions between respective source regions and first drain regions of the third and the fourth transistors.

BRIEF DESCRIPTION OF THE DRAWINGS

FIGS. 3A, 3D, 3E and 3F are perspective views, FIG. 3B is modified circuit schematic and FIG. 3C is a top view of a memory device according to another embodiment.

FIGS. 4A-4S are side cross sectional views and FIGS. 4T, 4U, 4W and 4X are perspective views of steps in a method of making a memory device according to the embodiment of FIGS. 3A-3F.

FIGS. 5A, 5C-5E, 5G-5H, 5J and 5L-5O are side cross sectional views and FIGS. 5B, 5F, 5I and 5K are top cross sectional views of steps in a method of making a memory device according to another embodiment.

DETAILED DESCRIPTION

Figure 1A:
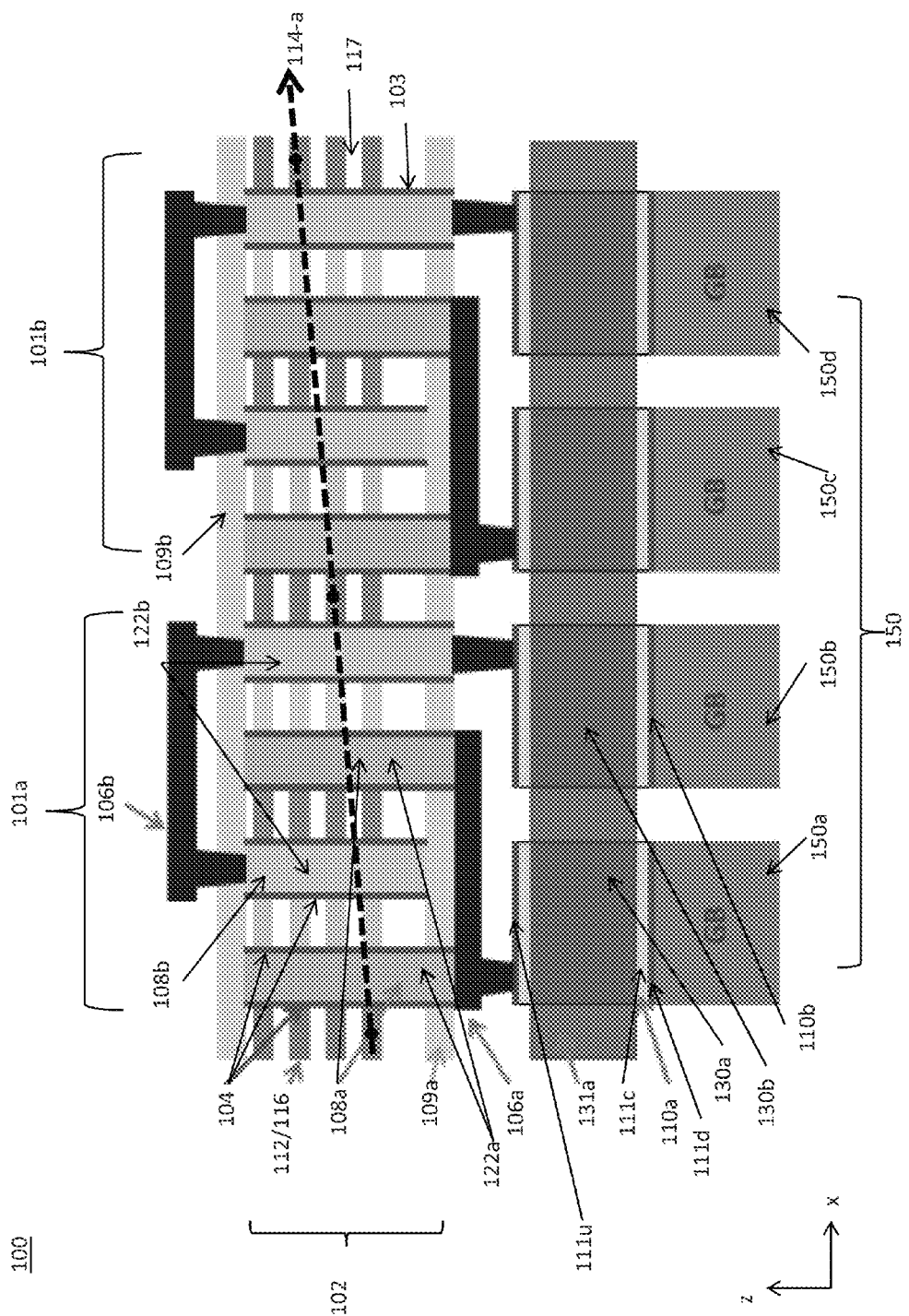
FIG. 1A is a side cross sectional view along line A-A' in FIG. 1B

Embodiments of the present description will be described below with reference to the accompanying drawings. It should be understood that the following description is intended to describe exemplary embodiments of the description, and not to limit the description Referring to FIGS. 1A and 1B, a memory device 100 of one embodiment includes plural (e.g., at least two, such as four) interdigitated word lines and a single select transistor controlling plural (e.g., at least two) local bit lines. The device 100 includes a memory cell region 102 containing a plurality of memory cells 104 located in the memory cell region 102. As shown, the memory device includes two identical memory device modules (e.g., sections) 101a and 101b, arranged side by side. However, it is to be understood that various embodiments may include more or fewer memory device modules 101, e.g., 1, 10, 100, 1,000 or more, e.g., in the range of one to a trillion or any sub-range thereof. In some embodiments, the memory device modules 101 may be arranged, e.g., in two dimensional planar array (e.g., a rectangular array), or in any other suitable regular, irregular, or random pattern.

The memory device 100 also includes a first bit line interconnect 106a and a second bit line interconnect 106b in module 101a. Module 101b contains similar bit line interconnects. A first plurality of electrically conductive local bit lines 108a extend in a substantially vertical direction into the memory cell region 102 (e.g., in the z-direction in FIG. 1A). A substantially vertical direction includes the vertical direction (e.g., perpendicular to the top substrate surface) and directions within 20 degrees from the vertical direction. As shown, two local bit lines 108a are provided per module 101a, but in other embodiments more maybe be used, e.g., 3, 4, 5, 6, 7 8, 9, 10 or more such as in the range of 2-100 or any sub-range thereof. Each local bit line 108a (e.g., both lines 108a) in the first plurality of electrically conductive local bit lines is electrically connected to the first bit line interconnect 106a.

A second plurality of electrically conductive local bit lines 108b extend in the substantially vertical direction into the memory cell region 102 and are horizontally offset from the first plurality of electrically conductive local bit lines 108a. As shown, two local bit lines 108b are provided per module 101b, but in other embodiments more maybe be used, e.g., 3, 4, 5, 6, 7 8, 9, 10 or more such as in the range of 2-100 or any sub-range thereof. Each local bit line 108b in the second plurality of electrically conductive local bit lines is electrically connected to the second bit line interconnect 106b. The first plurality of electrically conductive local bit lines 108b extend substantially 180 degrees (e.g., 180 degrees or within 160-200 degrees) from the second plurality of electrically conductive local bit lines 108b. For example, the lines 108a may extend from the interconnect 106a upward, while the lines 108b may extend from the interconnect 106b downward.

The first plurality of local bit 108a and first bit line interconnect 106a may be electrically insulated from the second plurality of local bit lines 108b and second bit line interconnect 106b. For example as shown in FIG. 1A, a first insulating layer 109a (e.g., an oxide or nitride layer, such as a horizontal silicon nitride etch stop layer) prevents the first bit line interconnect 106a from contacting the second plurality of local bit lines 108b. Similarly, a second insulating layer 109b (e.g., an oxide or nitride layer such as a horizontal silicon nitride etch stop layer) prevents the second bit line interconnect 106b from contacting the first plurality of local bit lines 108a.

A first select transistor 110a is electrically connected to the first bit line interconnect 106a, and is configured to select the first plurality of electrically conductive local bit lines 108a. A second select transistor 110b is electrically connected to the second bit line interconnect 106b, and is configured to select the second plurality of electrically conductive local bit lines 108b. The transistors 110 may be located below the memory cell region 102.

Figure 1B:
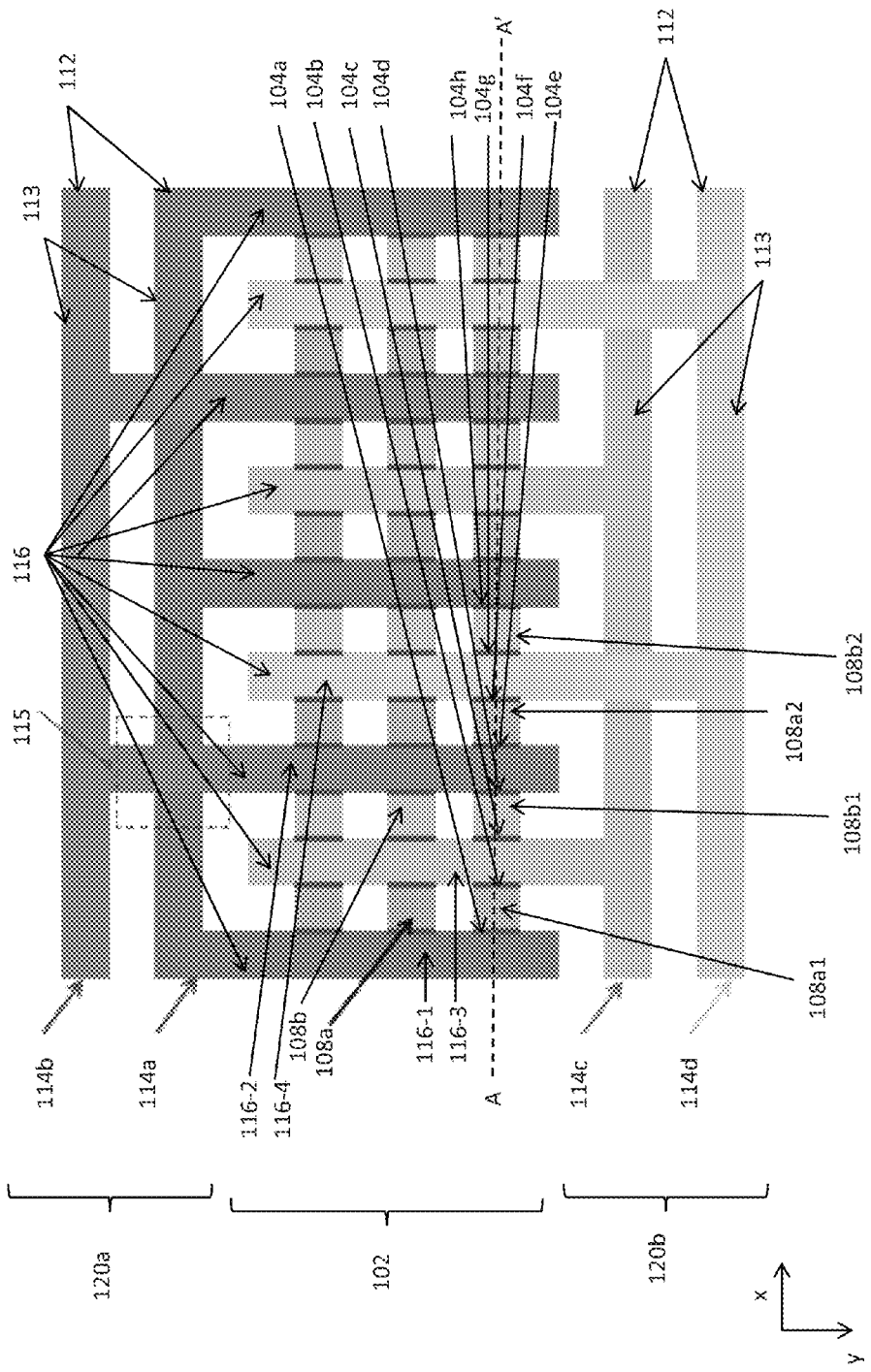
FIG. 1B is a top view of a memory device according to an embodiment.

A plurality of word lines 112 extend in a substantially horizontal direction into the memory cell region 102 (the y-direction in FIG. 1B). A substantially horizontal direction includes the horizontal direction (e.g., parallel to the top substrate surface) and directions within 20 degrees from the horizontal direction. As shown in FIG. 1B, four word lines 112 are provided, but in other embodiments more or fewer maybe be used, e.g., 2, 3, 4, 5, 6, 7 8, 9, 10 or more such as in the range of 2-100 or any sub-range thereof.

In some embodiments each word line 112 may include one or more word line combs 114. For example each of the plurality of word lines shown in FIG. 1B comprises a first word line comb 114a, a second word line comb 114b, a third word line comb 114c and a forth word line comb 114d. As shown, four words lines combs 114 are provided, but in other embodiments more or fewer maybe be used, e.g., 2, 3, 4, 5, 6, 7 8, 9, 10 or more such as in the range of 2-100 or any sub-range thereof. The location and direction of the comb 114a by the dashed line 114a in FIG. 1A and its electrical connection between the word line fingers 116 is shown by the black circles in the line 114a. The diagonal direction of the comb which extends in both vertical and horizontal directions will be explained in more detail with respect to FIGS. 3A-3F below.

Each word line comb 114 comprises a plurality of electrically conductive fingers 116. The plurality of electrically conductive fingers 116 for each word line comb 114 electrically contact other electrically conductive fingers of the same word line comb 114 and are electrically insulated from the electrically conductive fingers of the other word line combs 114. For example, the electrically conductive fingers 116 of the word line comb 114a are in electrical connection with each other, but insulated from word line combs 114b-114d. For example, the fingers 116 of the same comb 114 may be electrically connected to each other by a word line interconnect 113, such as a sidewall bridge described below in reference to FIGSs. 3A-3F. In some embodiments this is accomplished by providing vertically offset crossings for the word line combs 114. For example, in FIG. 1B, word line comb 114b crosses over or under word line comb 114a in the region 115. Detailed techniques for implementing crossovers of this type using the sidewall bridge are described in more detail below in reference to FIGS. 3A-3F.

In some embodiments, the fingers 116 of some of the word line 112 combs 114 (as shown, the first and second word line combs 114a and 114b) extend in a first substantially horizontal direction (as shown, the y-direction) from a first interconnect region 120a into a first side of the memory cell region 102.

In some embodiments, the fingers 116 of the remaining word line combs 114 (as shown the third and forth word line combs 114c, 114d) extend in a second substantially horizontal direction (the opposite of the y-direction as shown in FIG. 1B) from a second interconnect region 120b into a second side of the memory cell region 102 opposite to the first side of the memory cell region. The first substantially horizontal direction extends an angle of about 180 degrees (e.g., 160-200 degrees) with respect to the second horizontal direction. In some embodiments, the fingers 116 of the word line combs (as shown, the first, second, third and forth word line combs 114a-114d) are alternately interdigitated in the memory cell region 102.

The word lines are separated from each other in the vertical direction (z-direction) by insulating layers 117. Thus, each finger 116 is separated from an overlying and/or underlying finger by a respective insulating layer 117.

In some embodiments a row through the memory cell region 102 along a horizontal direction substantially perpendicular to the first and the second substantially horizontal directions (the x-direction, indicated with a dashed line A-A' in FIG. 1B) comprises at least four fingers of the word line combs, at least four local bit lines, and at least eight memory cells arranged in a following order: a first finger 116-1 of the first word line comb 114a, a first memory cell 104a, a first local bit line 108a1 of the first plurality of electrically conductive local bit lines 108a, a second memory cell 104b, a first finger 116-3 of the third word line comb 114c, a third memory cell 104c, a first local bit line 108b1 of the second plurality of electrically conductive local bit lines 108b, a fourth memory cell 104d, a first finger 116-2 of the second word line comb 114b, a fifth memory cell 104e, a second local bit line 108a2 of the first plurality of electrically conductive local bit lines 108a, a sixth memory cell 104f, a first finger 116-4 of the fourth word line comb 114d, a seventh memory cell 104g, a second local bit line 108b2 of the second plurality of electrically conductive local bit lines 108b, and an eighth memory cell 104h. The pattern then repeats itself in the x-direction one or more times.

Each memory cell 104 is in contact with one finger 116 of one word line comb 114 and with one local bit line 108, and so may be individually addressed. In various embodiments, the memory cells 104 may be any type of memory cells know in the art including, e.g., transistor based memory sells (e.g., NAND cells) or variable resistivity state memory cells. For example, in some embodiments, the memory device 100 comprises a monolithic, three dimensional resistive random access (ReRAM) non-volatile memory device, where the plurality of memory cells 104 comprise a plurality of variable resistance elements that include a resistivity switching material 103 located at an intersection of and in contact with one finger 116 of one word line comb 114 and one local bit line 108. The material 103 may be a material layer which extends along the sidewalls of the local bit lines 108. The material 103 may comprise any suitable variable resistivity material that can have different electrical resistivity depending on the state, the phase, or the density of microscopic structures such as filaments, within the material. In one embodiment, the variable resistivity material 103 is a read/write non-volatile memory (NVM) material selected from a chalcogenide and a metal oxide material, and exhibits a stable, reversible shift in resistance in response to an external voltage applied to the material or to a current passed through the material. For example, the material 103 may comprise a metal oxide, such as TiOx, HfOx, ZrOx, WOx, NiOx, CoOx, CoAlOx, MnOx, $ZnMn_2O_4$, ZnOx, TaOx, NbOx, HfSiOx, or HfAlOx, where "x" indicates either a stoichiometric metal oxide (e.g., $HfO_2$) or a non-stoichiometric metal oxide (e.g., $HfO_{2-y}$). Alternatively, the material 103 may be a chalcogenide material, such as a chalcogenide glass, for example $Ge_xSb_yTe_z$, where preferably x=2, y=2 and z=5, GeSb, AgInSbTe, GeTe, GaSb, BaSbTe, InSbTe and various other combinations of these basic elements.

In some embodiments, the bit line interconnects 106 may be on opposing sides of the memory cell region 102. For example, as shown in FIG. 1A, the first bit line interconnect 106a is located below memory cell region 102 and the second bit line interconnect 106b is located above the memory cell region. The first plurality of electrically conductive local bit lines 108a extend into the memory cell region 102 from below and the second plurality of electrically conductive local bit lines 108b extend into the memory cell region from above.

In some embodiments, the first bit line interconnect 106a electrically connected to the first plurality of electrically conductive local bit lines 108a comprises a first bit line comb 122a. The second bit line interconnect 106b electrically connected to the second plurality of electrically conductive local bit lines 108b comprises a second bit line comb 122b.

The first and second bit line combs 122a and 122b may be arranged such that a local bit line 108a in the first bit line comb 122a is interdigitated between two electrically conductive local bit lines 108b in the second bit line comb 122b, and a local bit line 108b in the second bit line comb 122b is interdigitated between two electrically conductive local bit lines 108a in the first bit line comb 122a.

The memory device 100 may include a plurality of global bit lines 150, e.g., a first global bit line 150a and a second global bit line 150b. The device 100 may also include additional global bit lines 150c, 150d, etc.

In some embodiments, the first select transistor 110a comprises a first vertical thin film transistor having an upper source or drain region 111u of a first conductivity type located above a channel region 111c of a second conductivity type, a lower drain or source region 111d of the first conductivity type located below the channel region (e.g., in electrical contact with a global bit line 150a), and a first gate electrode 130a located adjacent to the channel region 111c.

In some embodiments, the second select transistor 110b comprises a second vertical thin film transistor having an upper a source or drain region 111u of the first conductivity type located above a channel region 111c of the second conductivity type, a lower drain or source region 111d of the first conductivity type located below the channel region (e.g., in electrical contact with a global bit line 150b), and a second gate electrode 130b located adjacent to the channel region.

In some embodiments, the upper source or drain region 111u of the first select transistor 110a is electrically connected to the first bit line interconnect 106a. The lower drain or source region 111d of the first select transistor 110a is electrically connected to the first global bit line 150a which is located below the first select transistor 110a.

In some embodiments, the upper source or drain region 111u of the second select transistor 110b is electrically connected to the second bit line interconnect 106b, as shown in FIG. 1A. The lower drain or source region 111d of the second select transistor 110b is electrically connected to the second global bit line 150b which is located below the second select transistor 110b.

In some embodiments, the first and the second global bit lines 150a and 150b each comprise elongated electrically conductive lines extending in a direction substantially parallel to the fingers 116 of the word line combs 114 (e.g., the y-direction).

In some embodiments, the first and the second gate electrodes 130a and 130b comprise first and second portions of a first select gate line 131a located adjacent to the respective first select transistor 110a and second select transistor 110b. In some embodiments, the first select gate line 131 comprises an elongated electrically conductive line extending in a substantially horizontal direction (the x-direction in FIG. 1A) substantially perpendicular to the first and the second global bit lines 150a and 150b and to the fingers 116 of the word lines combs 114.

Figure 1C:
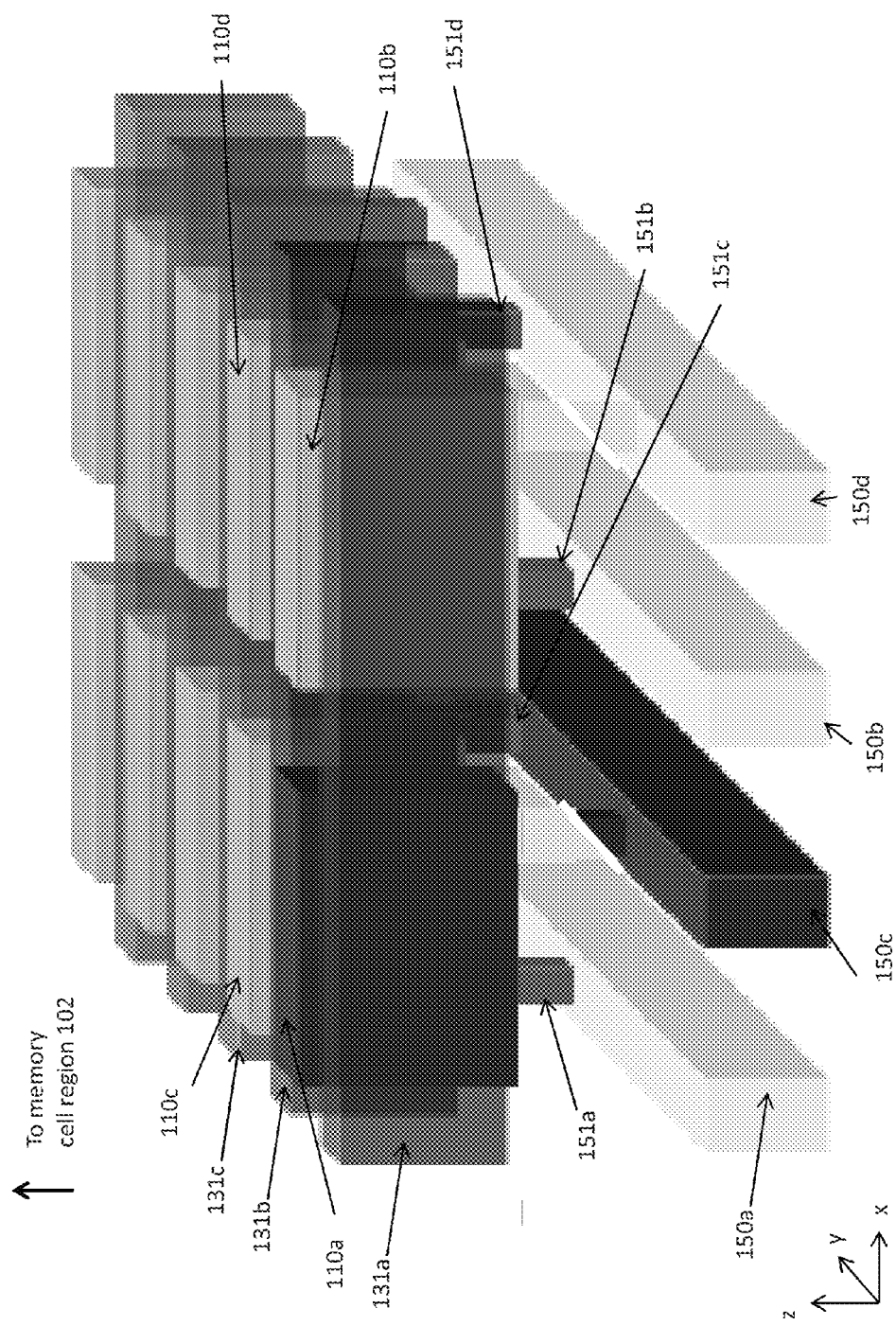
FIG. 1C is perspective view.
Figure 1D:
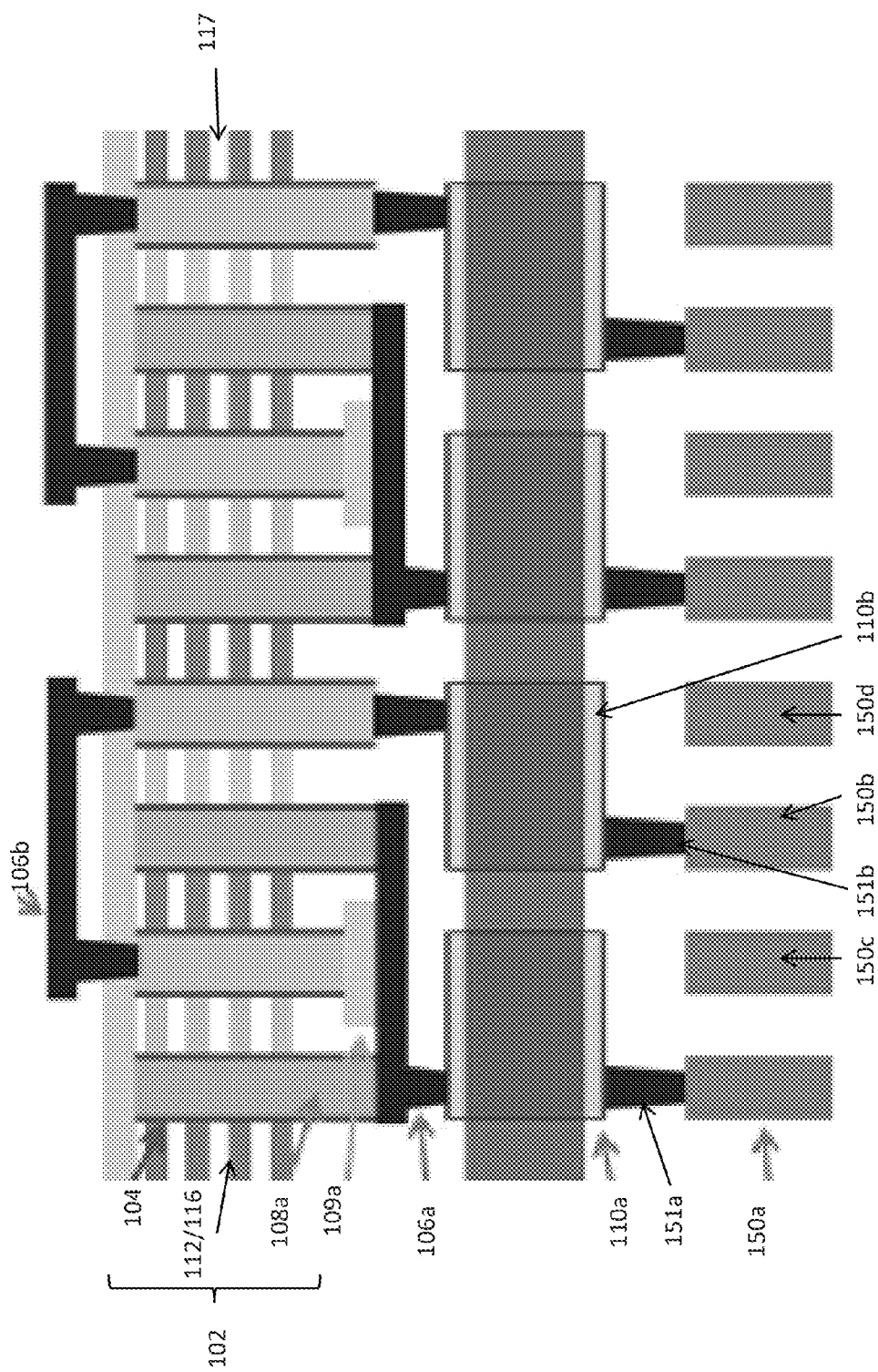
FIG. 1D is a side cross sectional view and FIG. 1E is a top view of a memory device according to another embodiment.

Referring to FIGS. 1C and 1D, in some embodiments, e.g., where the memory device features four or more memory modules 102 arranged in a two dimensional array, such as in a rectangular planar array, additional select transistors 110, select gate lines 131, and global bit lines 150 may be provided.

For example, in the embodiment shown in FIGS. 1C and 1D, each TFT select transistor 110 is a shared gate transistor with relatively wide channel regions extending over two adjacent global bit lines 150 but electrically contacting only one of the two global bit lines 150. Each select transistor 110 may have two gate electrodes 130 located on opposite side of the channel of the transistor. A gate insulating layer may be located between the channel and the gate electrode. The array shown in FIGS. 1C and 1D includes a third select transistor 110c which comprises a third vertical thin film transistor, a fourth select transistor 110d which comprises a fourth vertical thin film transistor, a third global bit line 150c located between the first and the second global bit lines 150a and 150b, and a fourth global bit line 150d located adjacent to the second global bit line 150b. Some embodiments further include a second select gate line 131b and a third select gate line 131c.

Some embodiments are arranged such that the first, the second, the third and the fourth global bit lines 150a-150d extend substantially parallel to each other in a substantially horizontal direction (as shown the y-direction) below the memory cell region 102. Optional respective electrodes 151a-151d electrically connect the source or drain region 111d of each transistor 110 to a respective global bit line 150a-150d. Alternatively, the electrodes 151 may be omitted and the source or drain region 111d of each transistor 110 may be located directly on the respective global bit line 150a-150d, as shown in FIG. 1A.

In some embodiments, the first, the second and the third select gate lines 131a, 131b, and 131c extend substantially parallel to each other in a substantially horizontal direction (as shown the x-direction) substantially perpendicular to the first, the second, the third and the fourth global bit lines 150a-150d.

In some embodiments, the first select transistor 110a is located above the first and the third global bit lines 150a and 150c, and between the first and the second select gate lines 131a and 131b. The second select transistor 110b is located above the second and the fourth global bit lines 150b and 150d, and between the first and the second select gate lines 131a and 131b. The third select transistor 110c is located above the first and the third global bit lines 150a and 150c and between the second and the third select gate lines 131b and 131c. The fourth select transistor is 110a is located above the second and the fourth global bit lines 150b and 150d, and between the second and the third select gate lines 131b and 131c.

As will be understood by one skilled in the art in view of the present disclosure, the above described embodiment allows each select transistor 110 to be used to select a respective bit line interconnect 106 and associated plurality of local bit lines 108. For example, the first select transistor 110a may be selected by switching on the first and second gate lines 131a and 131b along with the first global bit line 150a. The second select transistor 110b may be selected by switching on the first and second gate lines 131a and 131b along with the second global bit line 150b. The third select transistor 110c may be selected by switching on the second and third gate lines 131b and 131c along with the third global bit line 150c. The fourth select transistor 110d may be selected by switching on the second and third gate lines 131b and 131c along with the fourth global bit line 150d.

Moreover, some such embodiments may provide advantageous scaling. For example, referring to the embodiment shown in FIG. 1E, the width of the first select transistor 110a is about 3F in a direction (as shown the x-direction) substantially parallel to the first and second select gate lines, where F is a minimum feature size in a semiconductor process used to fabricate the memory device 100. In other words, the width of the channel 111c of the transistor 110a may be about 3F. The period between a corresponding point in the first and the second transistors 110a and 110b is about 4F in a direction (as shown the x direction) substantially parallel to the first and the second select gate lines 131a and 131b. The period between a corresponding point in the first and the third transistors 110a and 110c is about 2F in a direction (as shown, the y-direction) substantially perpendicular to the first and the second select gate lines 131a and 131b. The area of a select transistor module (indicated with dashed lines) containing one of the transistors 110 is about $8F^2$. The area of a memory device module 101 (not shown) located over the select transistor module is about $4F^2$. The word line finger 116 spacing in the memory cell 102 region is about 1F. In other words, the shared gate line configuration allows for two memory device modules 101 per select transistor module, reducing the memory device module area by a factor of two relative to the select transistor module area. In some embodiments, this scaling is advantageous because relatively wide channel thin film transistors may be used, mitigating or reducing potential imperfections or malfunctions (e.g., current leakage) related to using relatively thin channels (e.g., with a width of less than 3F) for the select transistors 110.

Figure 1E:
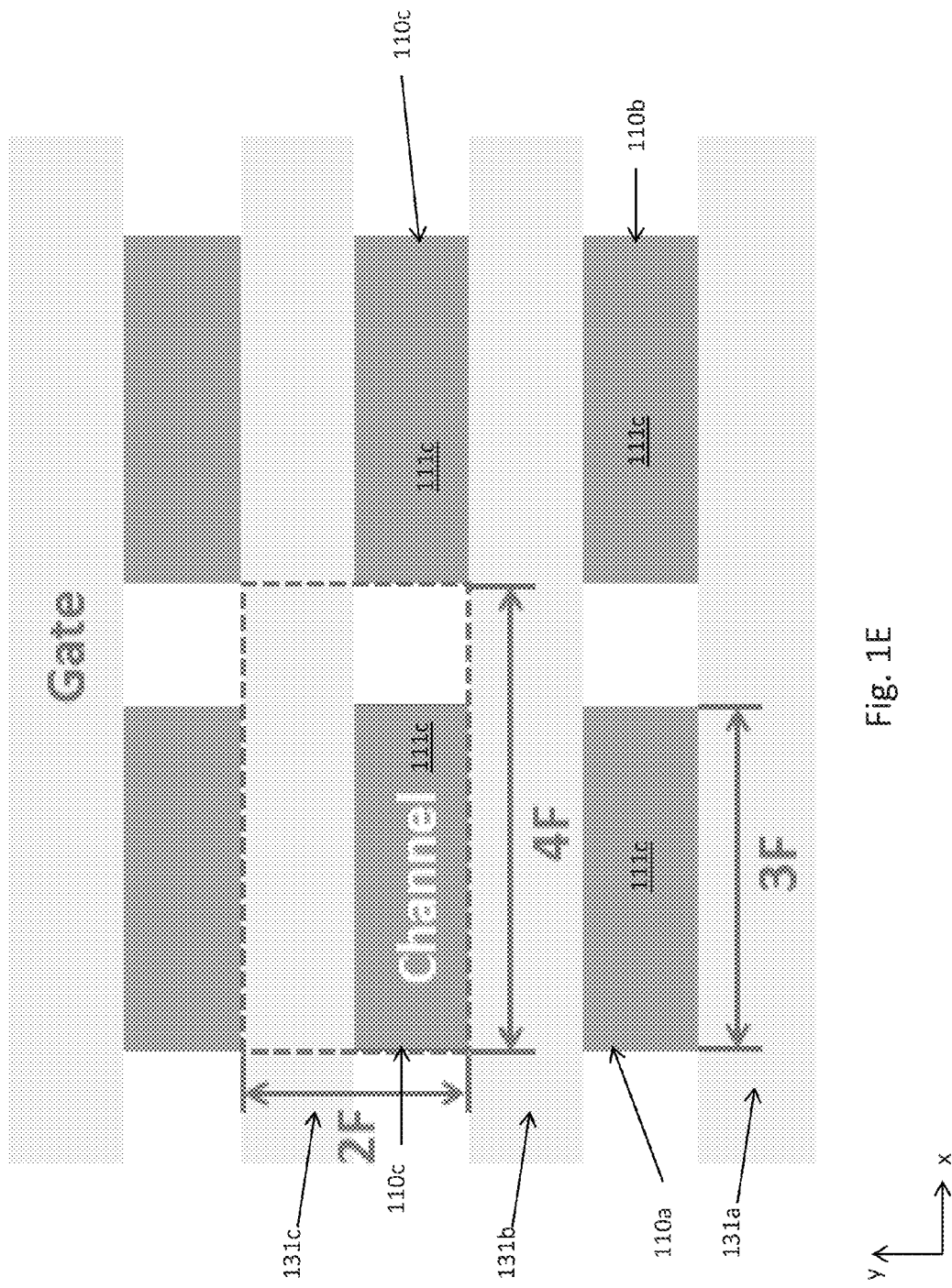
Figure 2A:
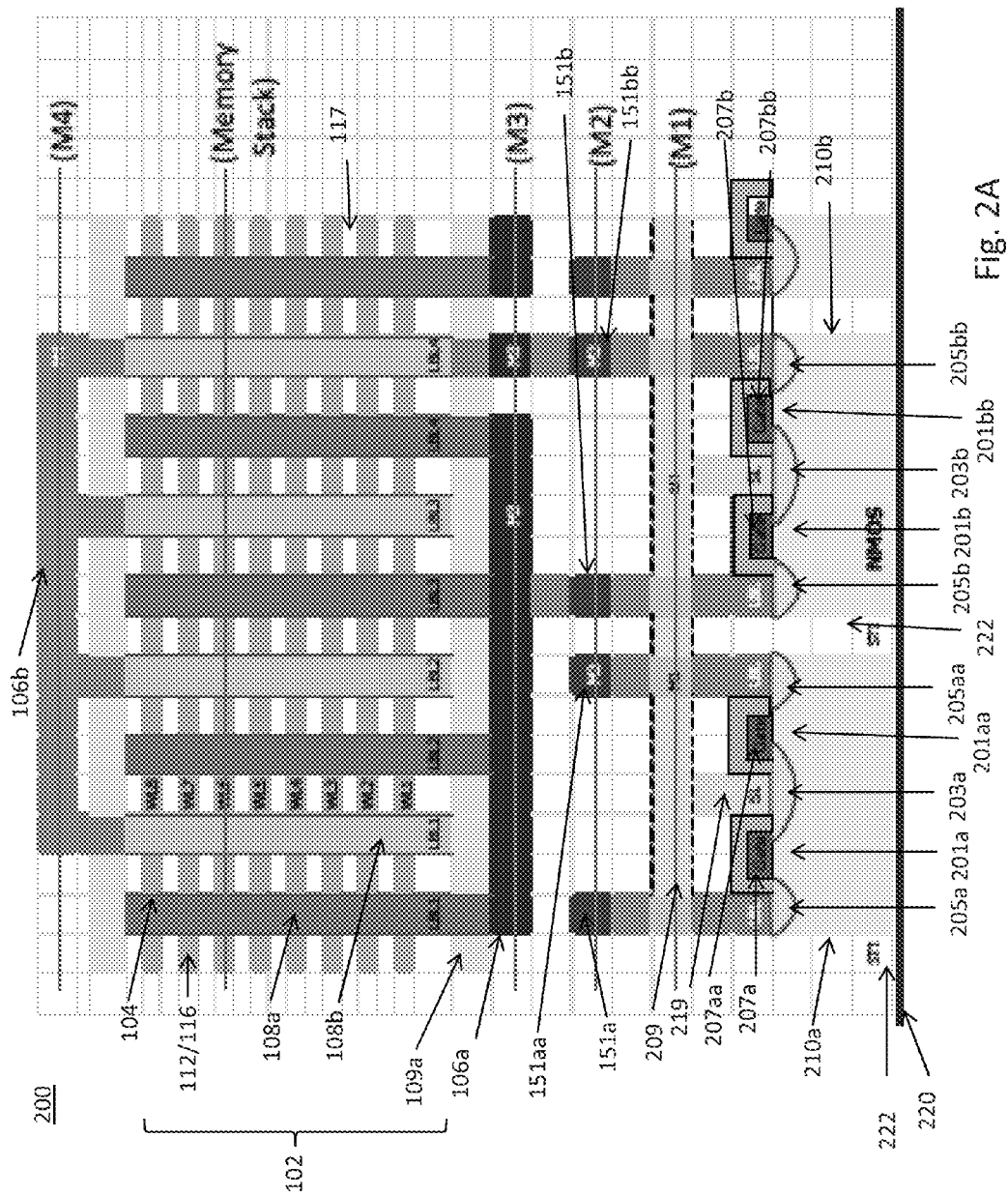
FIGS. 2A and 2B are side cross sectional views along rear plane (A) and front plane (B), respectively, of FIG. 2D, and FIGS. 2C-2F are perspective views a memory device according to another embodiment.
Figure 2B:
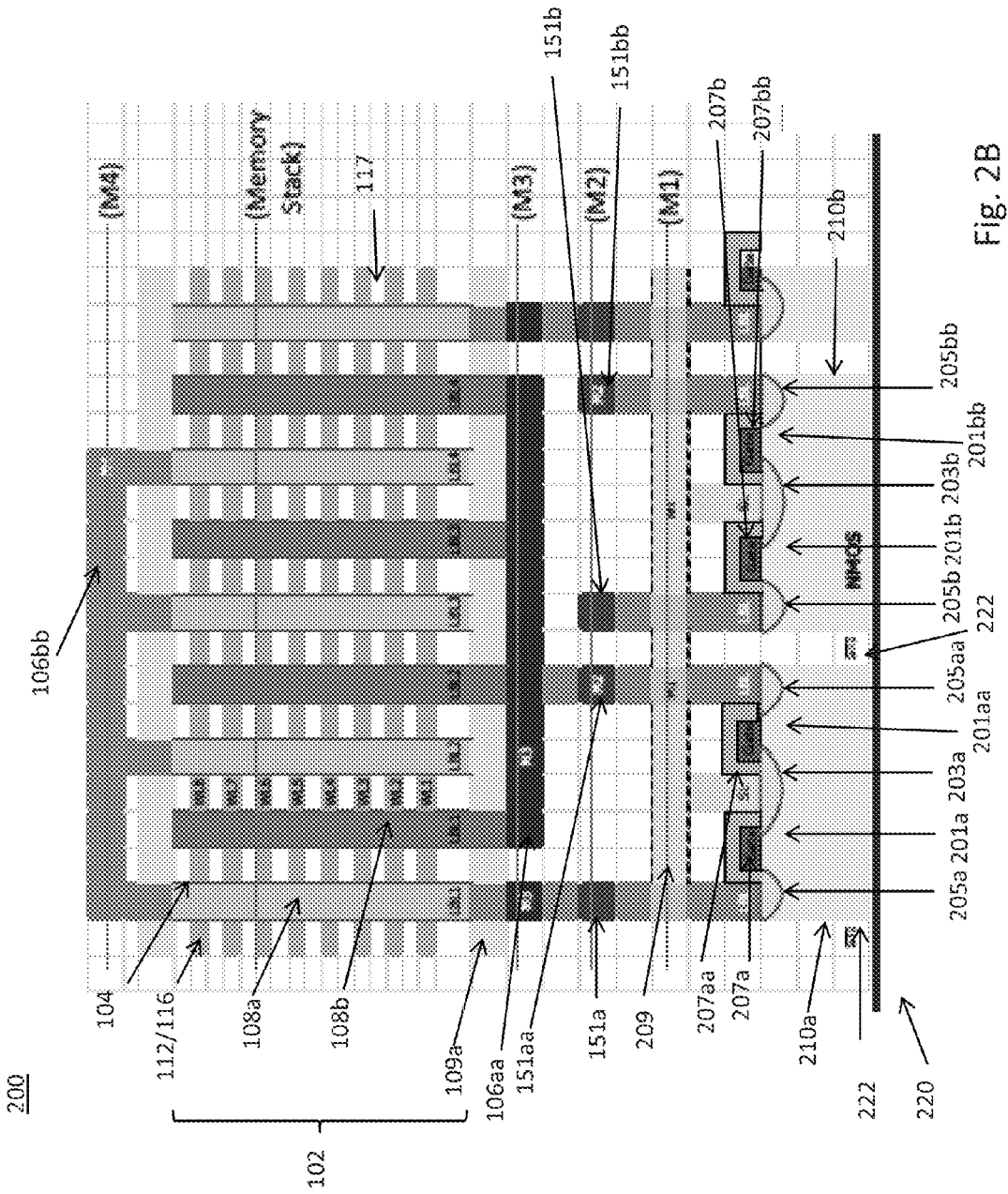
Figure 2C:
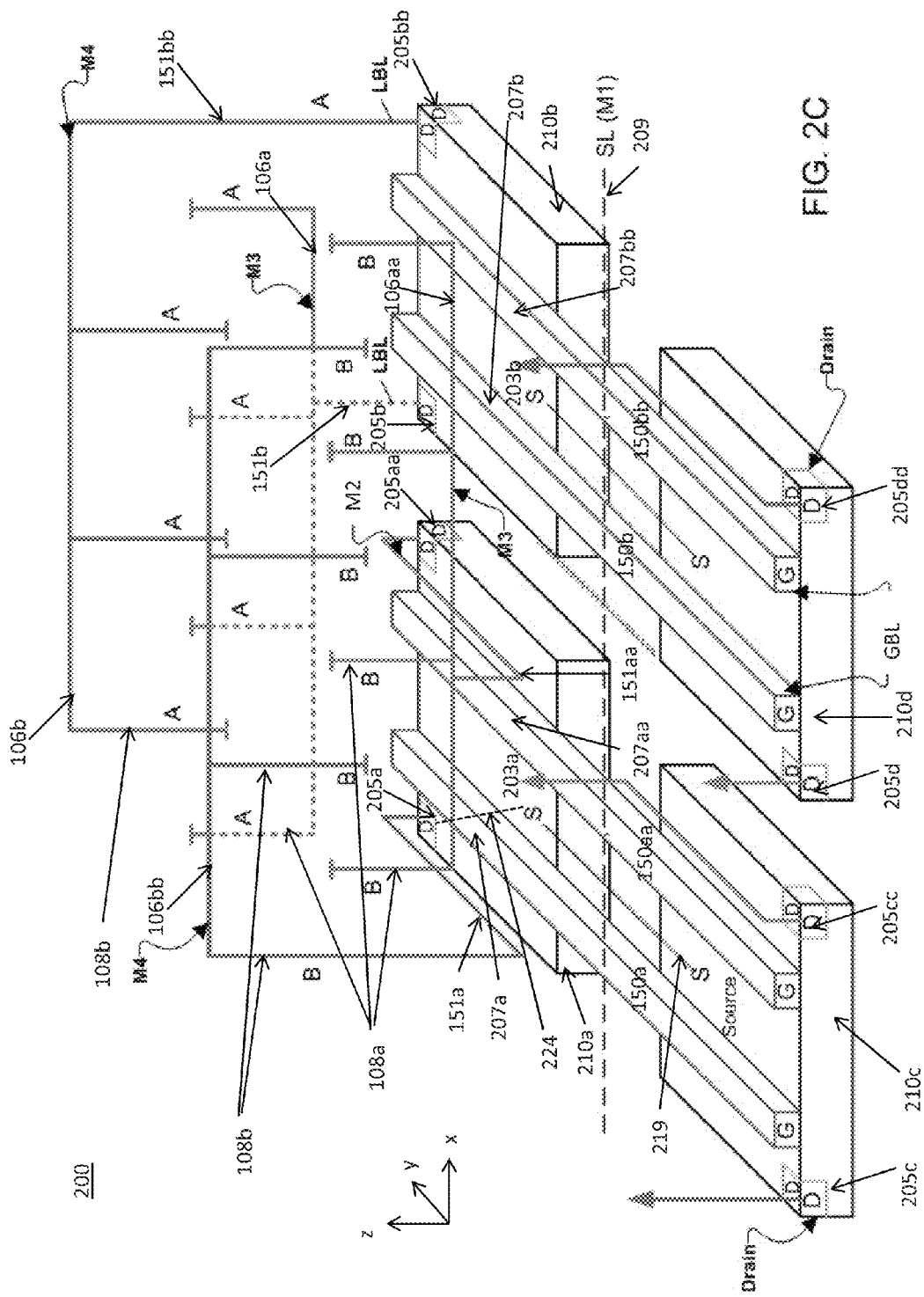
Figure 2D:
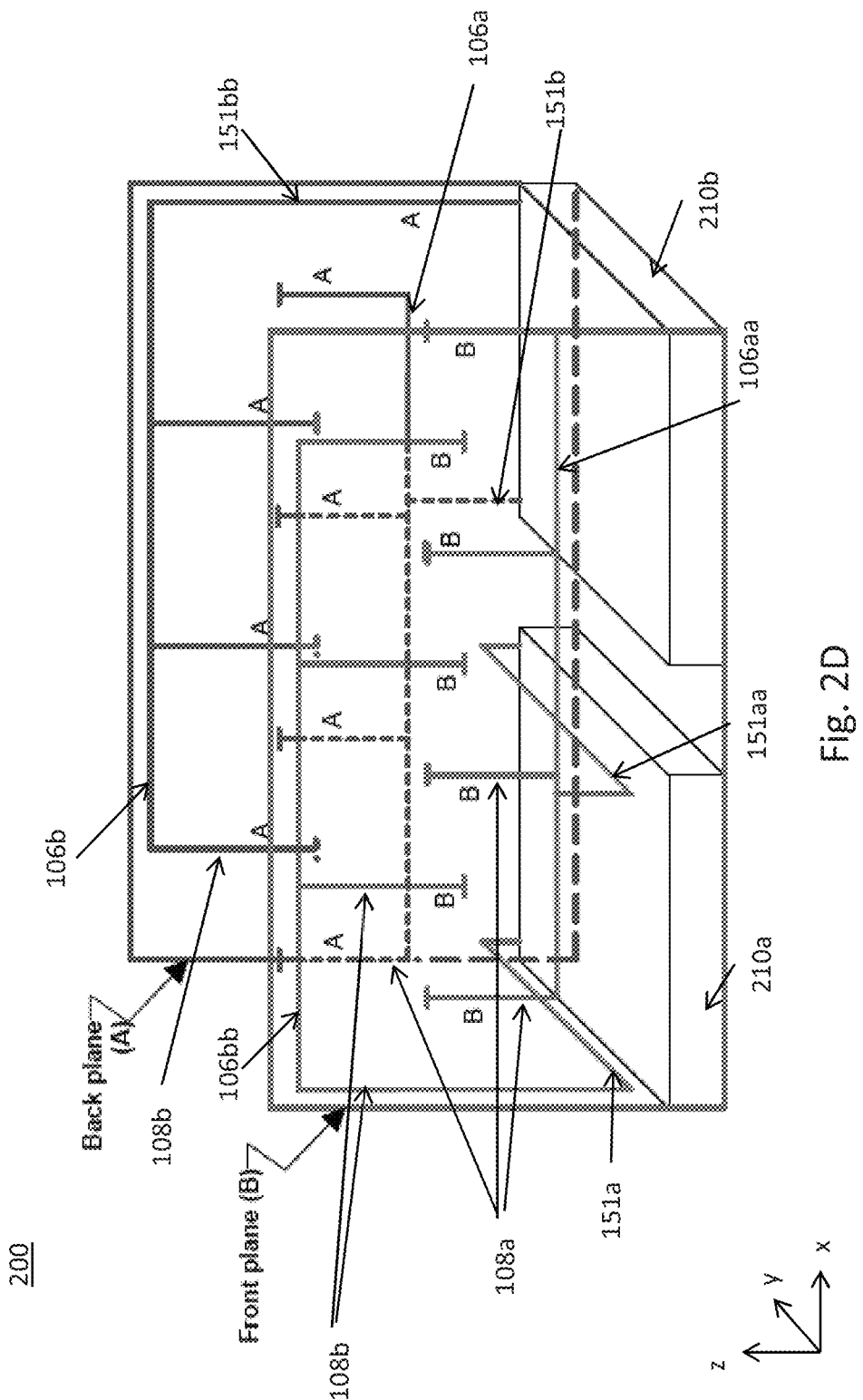

FIGS. 2A-D show views of an alternate embodiment of the memory device 200 which is different from the device 100 of FIGS. 1A, 1C and 1E. FIGS. 2A and 2B are vertical (i.e., side) cross sectional views along rear plane (A) and front plane (B), respectively, in the perspective view of FIG. 2D. FIG. 2D is a close up perspective view of a rear portion of FIG. 2C bounded by the planes (A) and (B) in FIG. 2C. For clarity, the word lines and resistivity switching material components of the device 200 are omitted in the perspective view of FIGS. 2C and 2D.

The device 200 of FIGS. 2A-2D differs from the device 100 shown in FIGS. 1A, 1C and 1E in several ways. First, the select transistors of the memory device may be planar transistors, e.g., formed at least partially in the upper portion of a substrate 220, rather than vertical TFTs formed over the global bit lines. Furthermore, at least some of the electrodes connecting the select transistors and the bit line interconnects may extend in both vertical and horizontal directions.

In the embodiments shown in FIGS. 2A-2D, the first select transistor 210a is planar transistor having a channel region 201a made of a semiconductor material of a second conductivity type located in a horizontal plane between source region 203a and drain region 205a made of a semiconductor region of a first conductivity type. The source region may be located out of the plane of FIG. 2A and the drain regions may be located out of the plane of FIG. 2B. However, each is shown in both FIGS. 2A and 2B to illustrate the relationship between the source and the drain. A gate electrode 207a for the first select transistor 210a is located adjacent to the channel region 201a, and is separated from the channel by a gate insulating layer (not shown for clarity). Optionally, the transistor 210a is a dual gate transistor containing two gates 207a, 207aa, two drain regions 205a, 205aa, and two channels 201a, 201aa on either side of the common source region 203a. The second select transistor 210b is planar transistor having a channel region 201b made of a semiconductor material of the second conductivity type located in a horizontal plane between source region 203b and drain region 205b made of a semiconductor region of the first conductivity type. A gate electrode 207b for the second select transistor 210b is located adjacent to the channel region 201b. Optionally, the transistor 210b is also dual gate transistor containing two gates 207b, 207bb, two drain regions 205b, 205bb, and two channels 201b, 201bb on either side of the common source region 203b.

For example, in some embodiments, the channel, source, and drain regions may be formed in an upper portion of the substrate 220 (e.g., proximal the major surface of the substrate), such as a silicon substrate. The source and drain regions may be formed using any suitable doping techniques, such as ion implantation. For example, if the transistors are NMOS transistors, then the substrate 220 may comprise a p-type doped silicon wafer such that the channel comprises a p-type silicon channel, while the source and drain regions comprise n-type doped regions, such as phosphorus or arsenic implanted regions. The adjacent transistors may be isolated from each other by any suitable isolation regions, such as shallow trench isolation (STI) regions 222.

As shown in FIGS. 2B and 2C, the source region 203*a* of the first select transistor 210*a* is electrically connected to the source line 209 which extends in level M1 (i.e., the first/lower metal level). The first (e.g., left side) drain region 205*a* of the first select transistor 210*a* is electrically connected to an upper bit line interconnect 106*bb* located in level M4 (i.e., the fourth/top metal level) in the front vertical plane (B) by the electrode 151*a* which has a horizontal portion extending in level M2 (i.e., the second/middle metal level) from the rear vertical plane (A) to the front vertical plane (B). The second (e.g., right side) drain region 205*aa* of the first select transistor 210*a* is electrically connected to a lower bit line interconnect 106*aa* located in level M3 (i.e., the third/upper metal level) in the front vertical plane (B) by the electrode 151*aa* which has a horizontal portion extending in level M2 (i.e., the second/middle metal level) from the rear vertical plane (A) to the front vertical plane (B). The first (e.g., left side) gate electrode 207*a* of the first select transistor is connected to or comprises a portion of the global bit line 150*a* which is located below level M1. The second (e.g., right side) gate electrode 207*aa* of the first select transistor is connected to or comprises a portion of the global bit line 150*aa* which is located below level M1.

As shown in FIGS. 2A and 2C, the source region 203*b* of the second select transistor 210*b* is electrically connected to the source line 209 which extends in level M1 (i.e., the first/lower metal level). The first (e.g., left side) drain region 205*b* of the second select transistor 210*b* is electrically connected to another lower bit line interconnect 106*a* located in level M3 (i.e., the third/upper metal level) in the rear vertical plane (A) by the electrode 151*b* which extends vertically through level M2 (i.e., the second/middle metal level). The second (e.g., right side) drain region 205*bb* of the second select transistor 210*b* is electrically connected to another upper bit line interconnect 106*b* located in level M4 (i.e., the fourth/top metal level) the rear vertical plane (A) by the electrode 151*bb* which extends vertically through level M2 (i.e., the second/middle metal level). The first (e.g., left side) gate electrode 207*b* is connected to or comprises a portion of a global bit line 150*b* which is located below level M1. The second (e.g., right side) gate electrode 207*bb* is connected to or comprises a portion of a global bit line 150*bb* which is located below level M1.

Thus, the electrodes 151*b*, 151*bb* extend vertically in the rear vertical plane (A). In contrast, the electrodes 151*a*, 151*aa* start out vertically in the rear vertical plane (A), then extend horizontally in level M2 from plane (A) to the front vertical plane (B) and then again extend vertically in plane (B).

In some embodiments, the gate electrode 207*a* of the first select transistor comprises a portion of the global bit line 150*a*. The global bit line 150*a* extends in a first horizontal direction (e.g., y-direction) over the first planar select transistor 210*a* and an imaginary straight line 224 signifying the charge carrier (e.g., electron) flow direction in the channel between the source 203*a* and the drain 205*a* of the first planar select transistor 210*a* extends in a second horizontal direction at an angle with respect to the first horizontal direction, e.g., an angle in the range of 20 to 70 degrees, as shown in FIG. 2C. A similar imaginary line signifies the charge carrier flow direction between the source 203*a* and drain 205*aa*.

Similarly, the gate electrode 207*b* of the second select transistor 210*b* comprises a portion of the global bit line 150*b*. The third global bit line extends in the first horizontal direction over the planar second select transistor 210*b* and an imaginary straight line between the source 203*b* and the drain 205*b* of the second planar select transistor 210*b* extends in a second horizontal direction at an angle with respect to the first horizontal direction, e.g., an angle in the range of 20 to 70 degrees, similar to line 224 for transistor 210*a*.

The source line 209 extends in a third horizontal direction (e.g., x-direction) which is substantially perpendicular to the first horizontal direction. The source line 209 may contain horizontally and/or vertically extending electrodes 219 which contact the source regions 203*a*, 203*b*.

Figure 2E:
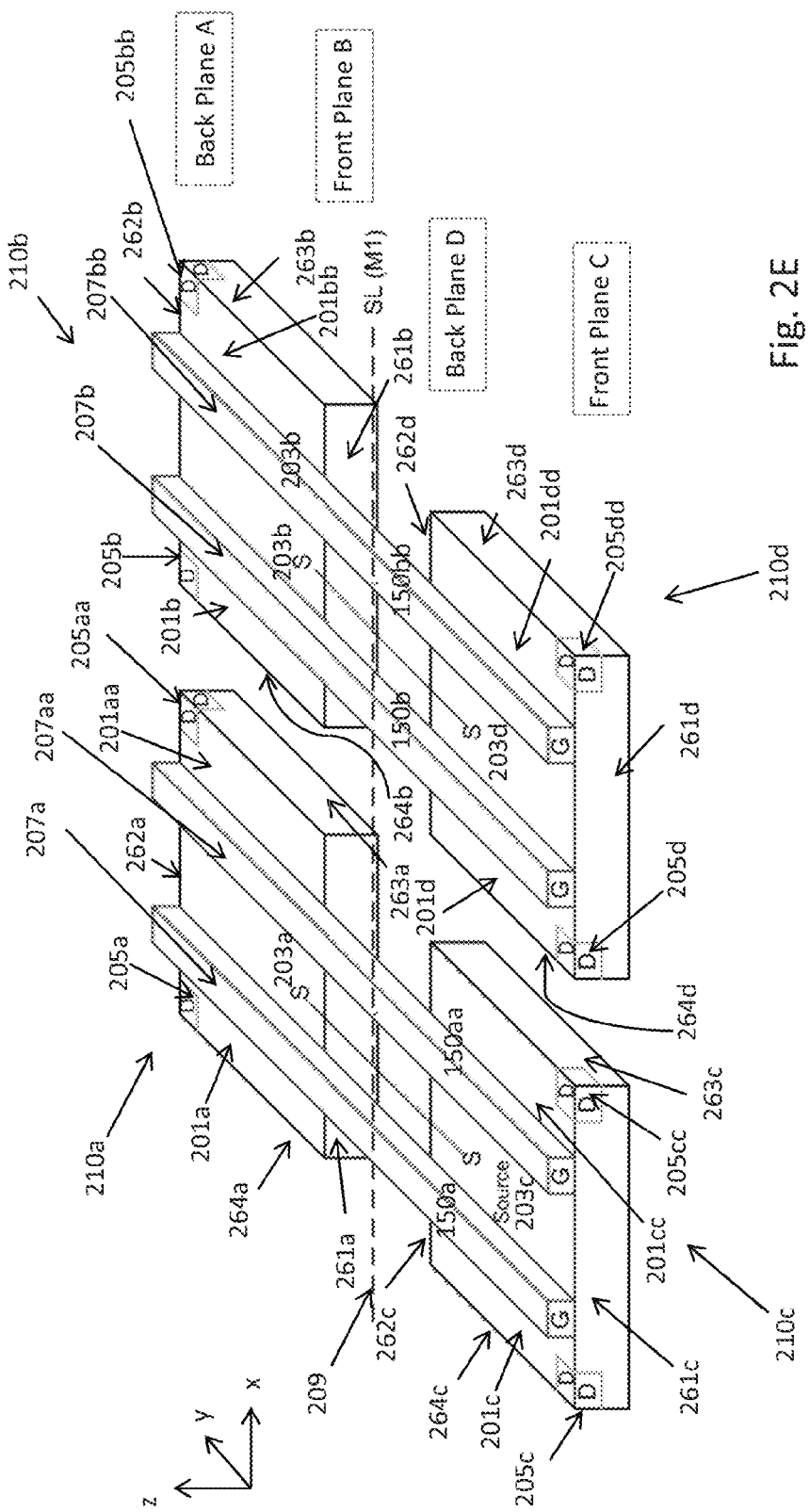

FIG. 2E illustrates the details of the four transistors 210*a*, 210*b*, 210*c* and 210*d* from FIG. 2C without illustrating the electrodes, interconnects and bit lines for clarity. A discussed above, each transistor 210*a*-210*d* has a first channel region 201*aa*, 201*b*, 201*cc* and 201*d* of a second conductivity type (e.g., p-type) located in a horizontal plane between respective source region 203*a*, 203*b*, 203*c* and 203*d* and a first drain region 205*aa*, 205*b*, 205*cc*, 205*d* of a first conductivity type (e.g., n-type).

Transistor 210*c* is located adjacent to transistor 210*a* in a first horizontal direction (e.g., the y-direction) in the horizontal plane. A first channel edge 261*a* containing the source region 203*a* of the transistor 210*a* faces a second channel edge 262*c* containing the source region 203*c* of transistor 210*c*. Transistor 210*b* is located adjacent to transistor 210*a* in a second horizontal direction (e.g., the x-direction) in the horizontal plane. A third channel edge 263*a* containing the first drain region 205*aa* of transistor 210*a* faces a fourth channel edge 264*b* containing the first drain region 205*b* of transistor 210*b*. The second horizontal direction (e.g., the direction) is substantially perpendicular to the first horizontal direction (e.g., the direction).

Transistor 210*d* is located adjacent to transistor 210*c* in the second horizontal direction (e.g., the x-direction) in the horizontal plane. A third channel edge 263*c* containing the first drain region 205*cc* of transistor 210*c* faces a fourth channel edge 264*d* containing the first drain region 205*d* of transistor 210*d*. Transistor 210*d* is also located adjacent to adjacent to transistor 210*b* in the first horizontal direction (e.g., the y-direction) in the horizontal plane. A first channel edge 261*b* containing the source region 203*b* transistor 210*b* faces a second channel edge 262*d* containing the source region 203*d* of transistor 210*d*.

In general, the first channel edge 261 of each transistor is located opposite the second channel edge 262 the same transistor, while the third channel edge 263 of each transistor is located opposite the fourth channel edge 264 of the same transistor. As shown in FIG. 2E, in the source region of each transistor 203 is offset in both the first and the second directions (i.e., in both the y and the x directions) with respect to the first drain region 205 of the same transistor (e.g., along line 224 shown in FIG. 2C).

As described above, the common source line 209 extends in the second direction (e.g., the x-direction) between transistors 210*a* and 210*c* and between transistors 210*b* and 210*d*. The source line 209 is electrically connected to the source regions 203*a*-203*d* of the respective transistors 210*a*-210*d*, as shown in FIG. 2C.

A first common gate electrode 150*aa* extends in the first direction (e.g., the y-direction) over the channel regions 201*aa*, 201*cc* between respective source regions 203*a*, 203*c* and the first drain regions 205*aa*, 205*cc* of transistors 210*a*, 210*c*. A second common gate electrode 150*b* extends in the first direction over the channel regions 201*b*, 201*d* between respective source regions 203*b*, 203*d* and first drain regions 205*b*, 205*d* of transistors 210*b*, 210*d*.

As described above, the transistors 210*a*-210*d* may be dual channel/dual gate transistors. In this embodiment shown in FIG. 1E, a second drain region 205*a* is located in a fourth channel edge 264*a* of transistor 210*a*, a second drain region 205c is located in a fourth channel edge 264c of transistor 201c, a second drain region 205bb is located in a third channel edge 263b of transistor 210b, and a second drain region 205dd is located in a third channel edge 263d of transistor 210d. A third common gate electrode 150a extends in the first direction (e.g., the y-direction) over the channel regions 201a, 201c between respective source regions 203a, 203c and second drain regions 205a, 205c of transistors 210a, 210c. A fourth common gate electrode 150bb extends in the first direction over the channel regions 201bb, 201dd between respective source regions 203b, 203d and second drain regions 205bb, 205dd of transistors 210b, 210d. The first common gate 150aa electrode is connected to or comprises a portion of the first global bit line, the second common gate electrode 150b is connected to or comprises a portion of the second global bit line, the third common gate electrode 150a is connected to or comprises a portion of the third global bit line, and the fourth common gate electrode 150bb is connected to or comprises a portion of the fourth global bit line.

Figure 2F:
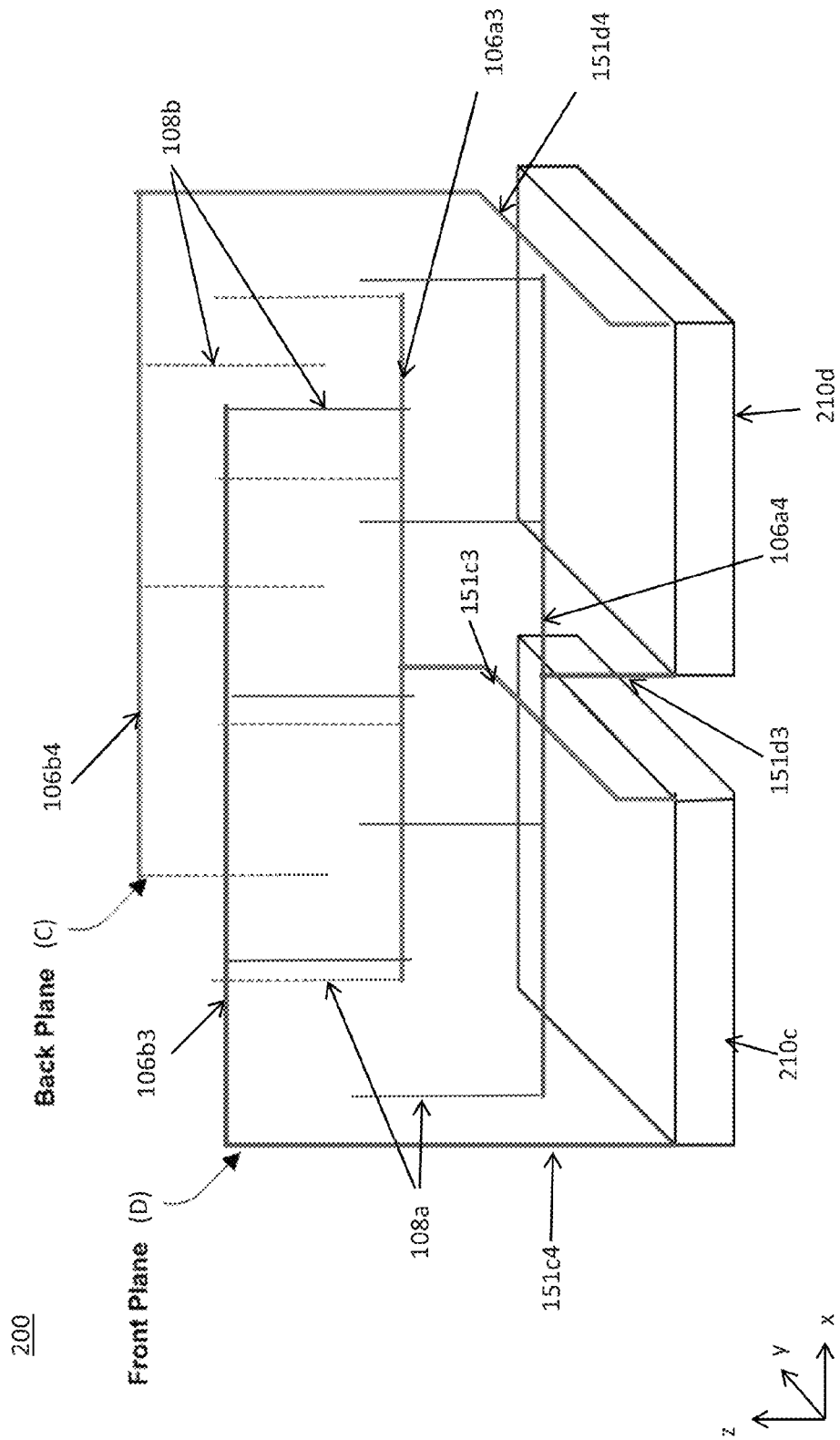

FIG. 2F is a close up perspective view of a front portion of FIGS. 2C and 2E bounded by the planes (C) and (D) in FIGS. 2C and 2E. As shown in FIGS. 2C and 2F, the first drain region 205aa, 205b, 205cc, 205d of the respective select transistors 210a, 210b, 210c and 210d is electrically connected to a respective first 106aa, second 106a, third 106a3 and fourth 106a4 lower bit line interconnects. The second drain region 205a, 205bb, 205c, 205dd of the respective select transistors 210a, 210b, 210c and 210d is electrically connected to a respective first 106bb, second 106b, third 106b3 and fourth 106b4 upper bit line interconnects. The third 106a3 and fourth 106a4 lower bit line interconnects are connected to the respective drain regions by respective electrodes 151c3 and 151d3. The third 106b3 and fourth 106b4 upper bit line interconnects are connected to the respective drain regions by respective electrodes 151c4 and 151d4, as shown in FIG. 2F.

The first 106aa, second 106a, third 106a3 and fourth 106a4 lower bit line interconnects are located below memory cell region 102, while the first 106bb, second 106b, third 106b3 and fourth 106b4 upper bit line interconnects are located above the memory cell region 102, as shown in FIGS. 2A-2B.

A first plurality of electrically conductive local bit lines 108a are located in the vertical plane (C). These bit lines extend into the memory cell region 102 from below and are electrically connected to the lower bit line interconnect 106a3, as shown in FIG. 2F. A second plurality of electrically conductive local bit lines 108a are located in the vertical plane (D). These bit lines extend into the memory cell region 102 from below and are electrically connected to the lower bit line interconnect 106a4, as shown in FIG. 2F.

A third plurality of electrically conductive local bit lines 108a are located in the vertical plane (B). These bit lines extend into the memory cell region 102 from below and are electrically connected to the lower bit line interconnect 106aa, as shown in FIGS. 2C and 2D. A fourth plurality of electrically conductive local bit lines 108a are located in the vertical plane (A). These bit lines extend into the memory cell region 102 from below and are electrically connected to the lower bit line interconnect 106a, as shown in FIG. 2C.

A fifth plurality of electrically conductive local bit lines 108b are interdigitated with the second plurality of electrically conductive local bit lines 108a in the vertical plane (D). These bit lines 108b extend into the memory cell region 102 from above and are electrically connected to the upper bit line interconnect 106b3, as shown in FIG. 2F. A sixth plurality of electrically conductive local bit lines 108b are interdigitated with the first plurality of electrically conductive local bit lines 108a in the vertical plane (C). These bit lines 108b extend into the memory cell region 102 from above and are electrically connected to the second upper bit line interconnect 106b4, as shown in FIG. 2F.

A seventh plurality of electrically conductive local bit lines 108b are interdigitated with the third plurality of electrically conductive local bit lines 108a in the vertical plane (B). These bit lines 108b extend into the memory cell region 102 from above and are electrically connected to the upper bit line interconnect 106bb. An eighth plurality of electrically conductive local bit lines 108b are interdigitated with the fourth plurality of electrically conductive local bit lines 108a in the vertical plane (A). These bit lines 108b extend into the memory cell region 102 from above and are electrically connected to the upper bit line interconnect 106b, as shown in FIGS. 2C-2D.

Figure 3D:
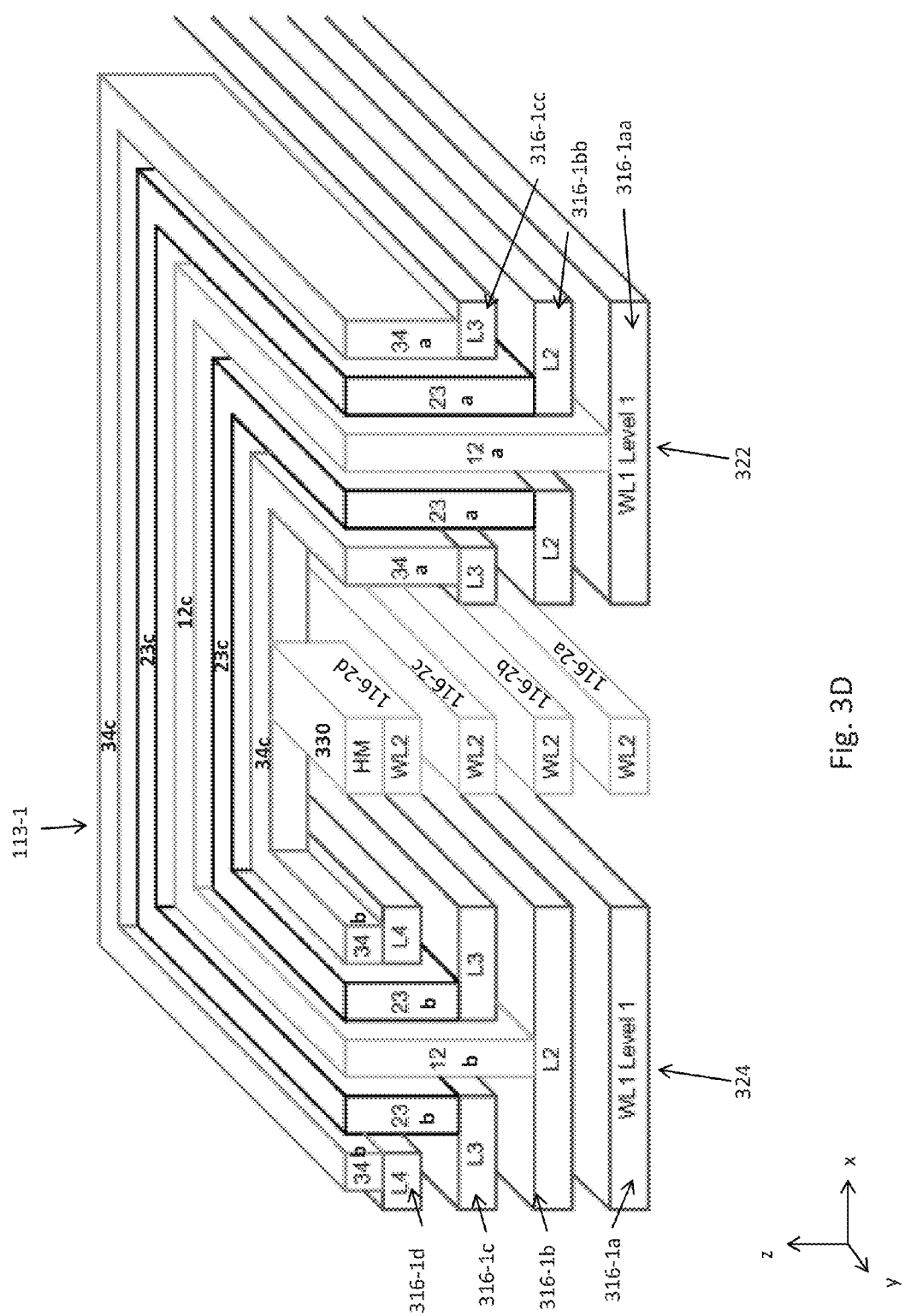
Figure 3E:
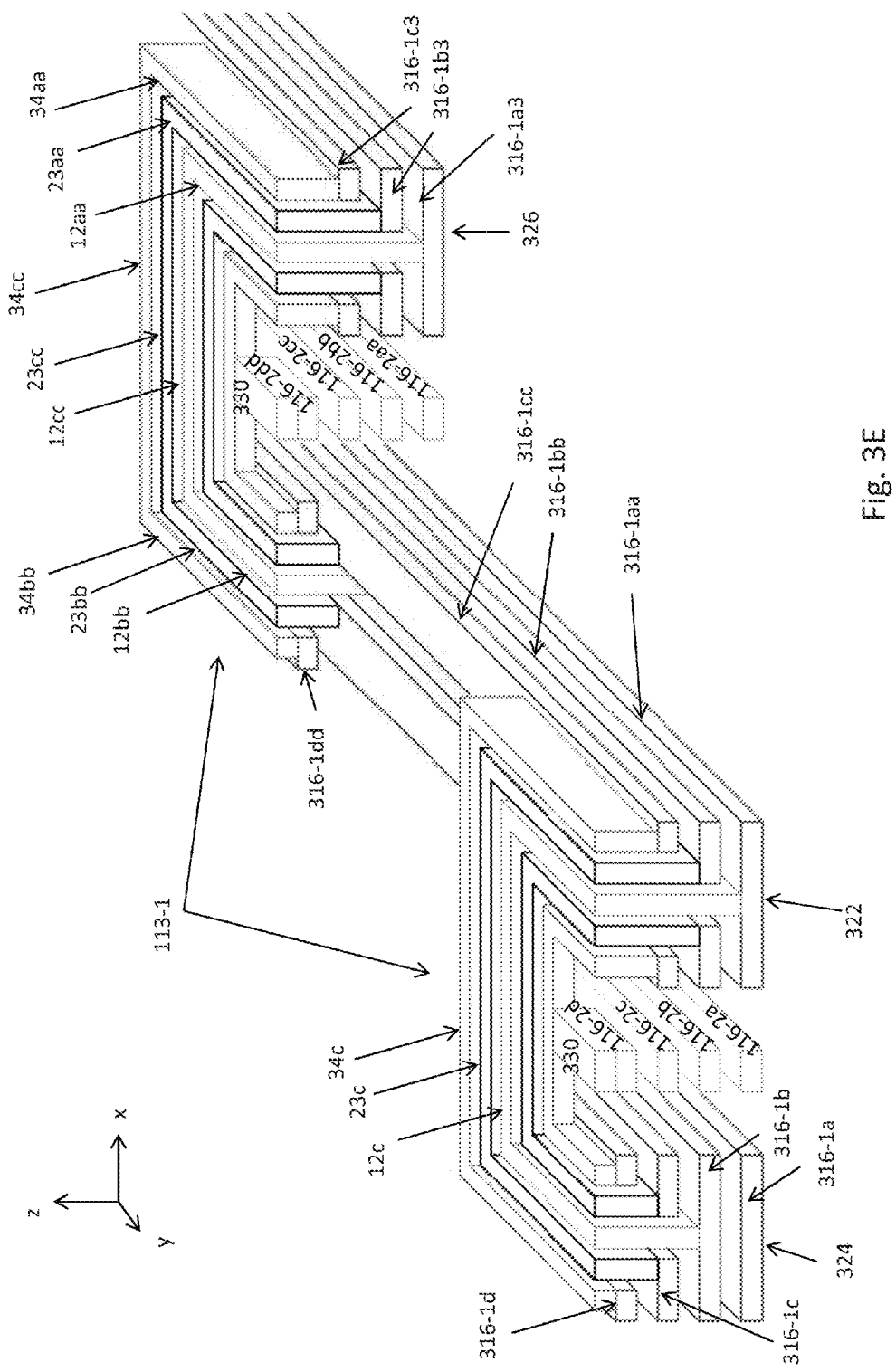
Figure 3F:
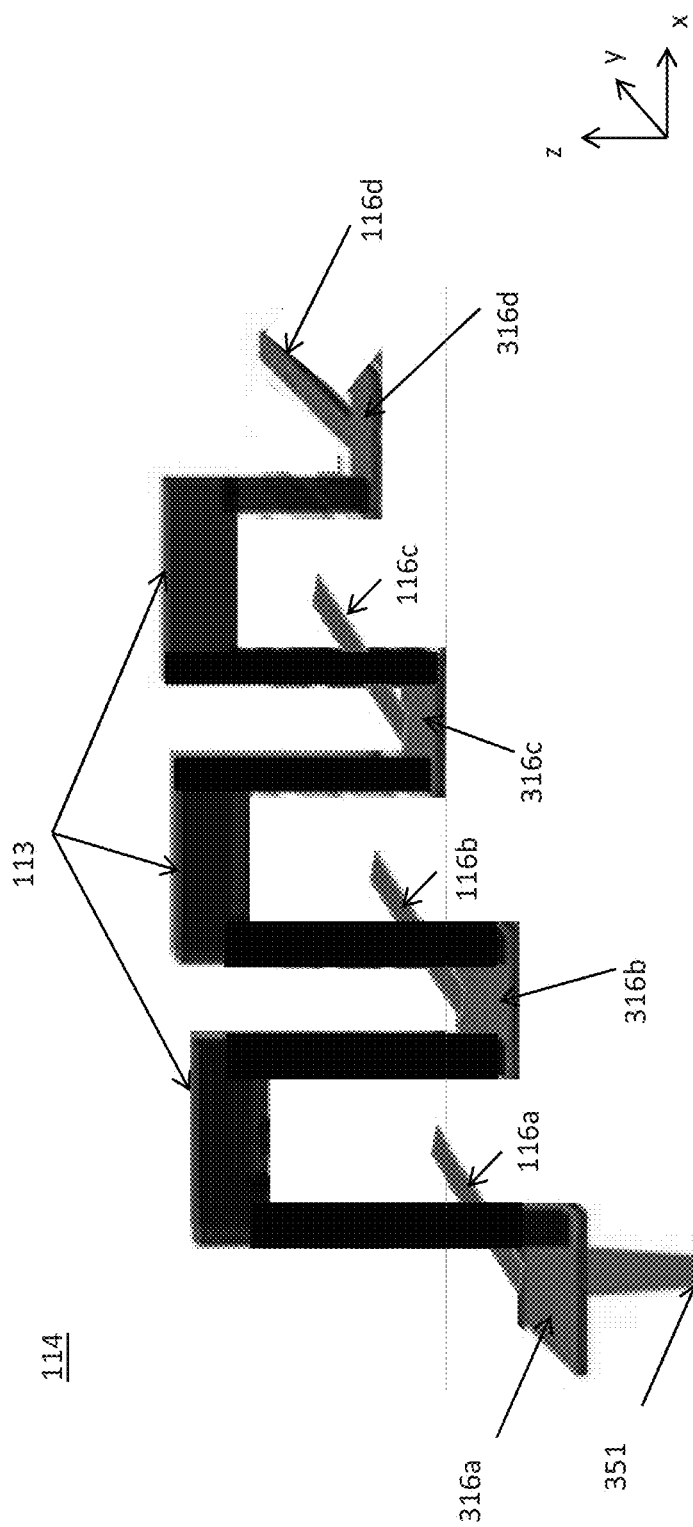

FIGS. 3A-3F illustrate a word line 112 contact scheme for a memory device of the types described herein, such as the devices of FIGS. 1A-1E or FIGS. 2A-2F. Specifically, FIGS. 3A-3F illustrate how the fingers 116 of the same comb 114 may be electrically connected to each other by a word line interconnect 113, such as a sidewall bridge word line interconnect in region 115 which is shown in FIG. 1B. FIG. 3A is a schematic perspective view of the word line combs and word line interconnects, while FIGS. 3B and 3C are respective electrical schematic view and top view of the word line combs and word line interconnects shown in FIG. 3A. FIGS. 3D, 3E and 3F are close up perspective views of a portion the word line combs and word line interconnects of FIGS. 3A and 3C.

As shown in FIGS. 3A, 3B and 3F, each of the first 114-1, second 114-2, third 114-3 and fourth 114-4 word line combs may be positioned diagonally with respect to the horizontal direction (e.g., the x-direction), such that one side of the comb (e.g., the left or the right side) is located below the opposite side (e.g., the other one of the left or the right side in FIGS. 3B and 3F) of the same comb. Thus, each comb extends in both the vertical direction (e.g., z-direction) and a first horizontal direction (e.g., the x-direction). The fingers 116 extend away from the interconnect 113 in the second horizontal direction (e.g., the y-direction) which is perpendicular to the first horizontal direction.

FIG. 3F shows one part of a word line comb 114 containing four contact pads and four associated fingers. The word line comb 114 may corresponds to one of word line combs 114a to 114d in FIG. 1B or it may correspond to one of the word line combs 114-1 to 114-4 in FIGS. 3A-3C. In general, the word line combs 114a to 114d in FIG. 1B may be the same as the respective word line combs 114-1 to 114-4 in FIGS. 3A-3C. Alternatively, the word line combs 114a to 114d in FIG. 1B each may extend in the same horizontal x-y plane and thus be different from the diagonal word line combs 114-1 to 114-4 in FIGS. 3A-3C which do not extend in the same horizontal plane and instead c as shown in FIGS. 3A, 3B and 3F.

A four finger portion of one exemplary word line comb 114 of an embodiment of the present disclosure, which may correspond to one of the combs 114-1 to 114-4 or to one of the combs 114a to 114d is shown in FIG. 3F. The comb 114 includes a first finger 116a located in a first device level (i.e., in level "a" or L1), a second finger 116b located in a second device level (i.e., in level "b" or L2) above the first device level, a third finger 116c located in a third device level (i.e., in level "c" or L3) above the second device level, and a fourth finger 116d located in a fourth device level (i.e., in level "d" or L4) above the third device level. The first, second, third and fourth fingers are offset from each other in a horizontal direction (e.g., the x-direction). A word line interconnect 113 (e.g., the sidewall bridge interconnect shown in FIGS. 3D and 3E) electrically connects the first, second, third and fourth fingers at their respective contact pads 316a, 316b, 316c and 316d, which are located in respective device levels a-d (e.g., L1-L4).

This diagonal word line comb configuration shown in FIGS. 3A, 3B and 3F allows each comb 114 to be connected to a driver circuit (e.g., via global word line 350) by a single electrode 351 connected to the lowest contact pad 316a. In other words, each word line comb is connected to a global word line 350 located below the memory cell region 102 by a respective electrode 351. This means that outside electrical connection to the upper levels of the word lines is not required and all outside electrical connections to diagonally stacked word line combs can be formed on the bottom side of the combs 114 and below the second level (e.g., level "b"/L2) of the memory cell region 102.

For example, as shown in FIGS. 3A and 3B, the first word line comb 114-1 includes a first finger 116-1a located in the first device level, a second finger 116-1b located in the second device level above the first device level, a third finger 116-1c located in the third device level above the second device level, and a fourth finger 116-1d located in the fourth device level above the third device level. The first, second, third and fourth fingers are offset from each other in a horizontal direction (e.g., the x-direction). The word line interconnect 113-1 electrically connects the first, second, third and fourth fingers.

As shown in FIG. 3C, the word line interconnects 113-1, 113-2, 113-3 and 113-4 are located outside the memory cell region 102 in one of the interconnect regions 120a or 120b which are spaced from the memory cell region 102 in a perpendicular horizontal direction (e.g., the y-direction). For example, the word line interconnect 113-1 of word line comb 114-1 shown in FIGS. 3A and 3B is located in interconnect region 120a in area 3A shown by the dashed lines in FIG. 3C. Interconnect 113-2 is also located in region 120a. Interconnects 113-3 and 113-4 are located in interconnect region 120b located on the opposite side of the memory cell region 102 from region 120a.

As shown in FIGS. 3A-3F, each word line finger 116 may include a contact pad 316 which is located in electrical contact with the respective finger 116. Preferably, the contact pad 316 is located in the same vertical device level as its respective finger 116. For example, as shown in FIG. 3C, each respective finger 116-1, 116-2, 116-3 and 116-4 contacts a respective contact pad 316-1, 316-2, 316-3 and 316-4 located in one of the interconnect regions 120a or 120b. The pads 316 are also located in the various vertical device levels. For example, the first word line comb 114-1 includes the first finger 116-1a which contacts pad 316-1a located in the first device level, the second finger 116-1b which contacts pad 316-1b located in the second device level above the first device level, the third finger 116-1c which contacts pad 316-1c located in the third device level above the second device level, and the fourth finger 116-1d which contacts pad 316-1ad located in the fourth device level above the third device level, as shown in FIGS. 3A and 3B.

As shown in FIG. 3F, the word line interconnect 113 contacts the contact pads 316 to form the word line combs 114. Thus, each word line comb 114 includes fingers 116, pads 316 and interconnect 113 which electrically connects the fingers 116 together into a single word line electrode by physically connecting the pads 316 of each finger 116 in the comb 114.

As further shown in FIGS. 3A and 3B, the first (lowest) device level contact pads 316-1a, 316-2a, 316-3a and 316-4a may have a bottom surface in contact with an optional respective word line electrode 350-1, 350-2, 350-3 and 350-4. Each word line electrode 350-1, 350-2, 350-3 and 350-4 is electrically connected to a respective global word line 351-1, 351-2, 351-3 and 351-4. The global word lines may extend in a horizontal direction (e.g., y-direction) below the memory cell region 102, and either above, below or co-planar with the global bit lines 150.

The details of sidewall bridge word line interconnect 113 in region 115 are illustrated in FIGS. 3D and 3E. FIGS. 3D and 3E are mirror image type views from the views of FIGS. 3A and 3B. Specifically, region 3D in FIG. 3A is a mirror image type close up of the interconnect shown in FIG. 3D.

The word line interconnect 113 (e.g., interconnect 113-1 shown in region 3D in FIG. 3A) includes a first conductive vertical rail 12a which extends in the first or the second horizontal direction (e.g., the horizontal y-direction or 180 degrees from the y-direction) and contacts a contact pad 316-1aa of the first finger 116-1aa in the first device level (e.g., in the lowest level "a" which corresponds to word line level "L1"). The word line interconnect 113 also includes a second conductive vertical rail 12b which extends in the same first or the second horizontal direction as the first rail (e.g., in the y-direction or 180 degrees from the y-direction) and contacts a contact pad 316-1b of the second finger 116-1b in the second device level. A first conductive sidewall bridge 12c extends in a third horizontal direction (e.g., in the x-direction) substantially perpendicular to the first and the second horizontal directions. The conductive sidewall bridge 12c contacts both the first 12a and the second 12b conductive vertical rails.

The conductive sidewall bridge, the conductive vertical rails, the contact pads and the fingers may comprise any one or more c The interconnect pattern of two rails contacting the contact pads in adjacent device levels and a sidewall bridge connecting the two rails is then repeated for the remaining contact pads in the remaining device levels.

Thus, a third conductive vertical rail 23a extends in the first or the second horizontal direction and contacts another contact pad 316-1bb of another second finger 116-1bb in the second device level (e.g., device level "b" which corresponds to word line level "L2"). The third conductive vertical rail 23a contains two portions which are located on opposite sides of the first rail 12a. The first rail 12a extends to pad 316-1aa through an opening the pads 316-1bb and 316-1cc, while the third rail 23a portions extend only partially through the opening in pad 316-1cc.

A fourth conductive vertical rail 23b extends in the first or the second horizontal direction and contacts a contact pad 316-1c of the third finger 116-1c in the third device level. The fourth conductive vertical rail 23b contains two portions which are located on opposite sides of the second rail 12b. The second rail 12b extends to pad 316-1b through an opening the pads 316-1c and 316-1d, while the fourth rail 23b portions extend only partially through the opening in pad 316-1d.

A second conductive sidewall bridge 23c extends in a third horizontal direction substantially perpendicular to the first and the second horizontal directions. The second bridge 23c contains two portions which are located on opposite sides of the first bridge 12c. The second bridge 23c contacts both the third 23a and the fourth 23b conductive vertical rails.

Furthermore, a fifth conductive vertical rail 34a extends in the first or the second horizontal direction and contacts a contact pad 316-1cc of the third finger 116-1cc in the third device level (e.g., device level "c" which corresponds to word line level "L3"). A sixth conductive vertical rail 34b extends in the first or the second horizontal direction and contacts a contact pad 316-1d of the fourth finger 316-1d in the fourth device level (e.g., device level "d" which corresponds to word line level "L4"). A third conductive sidewall bridge 34c extends in a third horizontal direction substantially perpendicular to the first and the second horizontal directions, and contacts both the fifth 34a and the sixth 34b conductive vertical rails.

The contact pads 316-1aa, 316-1bb and 316-1cc are stacked above each other in stack 322. The contact pads 316-1a, 316-1b, 316-1c and 316-1d are stacked above each other in stack 324 which is horizontally separated from stack 322 in the third horizontal direction (e.g., the x-direction). The fingers 116-2a, 116-2b, 116-2c and 116-2d of another word line comb 114-2 extend in the first or the second horizontal direction between the stacks 322 and 324.

The conductive sidewall bridges 12c, 23c and 34c of the word line interconnect 113-1 of word line comb 114-1 extend over the fingers 116-2a, 116-2b, 116-2c and 116-2d of the word line comb 114-2. The fingers 116-2a, 116-2b, 116-2c and 116-2d of word line comb 114-2 may be covered by an insulating layer 330, such as a silicon nitride hard mask layer, which electrically isolates the upper finger 116-2d from the conductive sidewall bridges 12c, 23c and 34c of the word line interconnect 113-1 of word line comb 114-1. The fingers 116-2a, 116-2b, 116-2c and 116-2d of word line comb 114-2 extend to a different word line interconnect 113-2 which is offset from the interconnect 113-1 in the first or the second horizontal directions in the interconnect region 120a, as shown in FIG. 3A.

The above pattern is repeated in the third horizontal direction (i.e., the x-direction), as shown in FIG. 3E. The contact pads 316-1aa, 316-1bb, 316-1cc and 316-dd in stack 322 extend in the first or the second horizontal directions (e.g., the y-direction or 180 degrees from the y-direction) past the sidewall bridges 12c, 23c and 34c.

As shown in FIG. 3E, a set vertical conductive rails 12bb, 23bb and 34bb contacts rear (or front depending on the viewpoint) of the respective contact pads 316-1bb, 316-1cc and 316-1dd in stack 322. Another set of conductive rails 12aa, 23aa and 34aa contacts rear (or front depending on the viewpoint) of the respective contact pads 316-1a3, 316-1b3 and 316-1c3 in stack 326. Another set of sidewall bridges 12cc, 23cc and 34cc connects the respective set of rails 12aa-12bb, 23aa-23bb and 34aa-34bb to each other.

Fingers 116-2aa, 116-2bb, 116-2cc and 116-2dd of another word line comb 114-2 extend in the first or the second horizontal direction between the stacks 322 and 326. The conductive sidewall bridges 12cc, 23cc and 34cc of the word line interconnect 113-1 of word line comb 114-1 extend over the fingers 116-2aa, 116-2bb, 116-2cc and 116-2dd of the word line comb 114-2. The above pattern is repeated for all interconnects in the third horizontal direction (i.e., the x-direction), as shown in FIGS. 3A-3C.

It should be noted that the word lines are separated from each other in the vertical direction (z-direction) by insulating layers 117 shown in FIGS. 1A and 2A, such as silicon oxide or silicon nitride layers. Thus, each pair of finger 116 and pad 316 in a stack are separated from an overlying and/or underlying finger and pad pair by a respective insulating layer. The insulating layers 117 are not shown in FIGS. 3A-3F for clarity.

While the interconnect is described above as the word line interconnect 113 which includes the rails and the sidewall bridges for a three dimensional ReRAM device, it should be understood that the interconnect may be used for any other suitable device, such another memory device (e.g., a NAND memory device) or a non-memory device, such as a logic device. Furthermore, the interconnect does not have to connect word line portions, such as combs, and may be used to connect bit line portions or any other conductors.

Figure 4W:
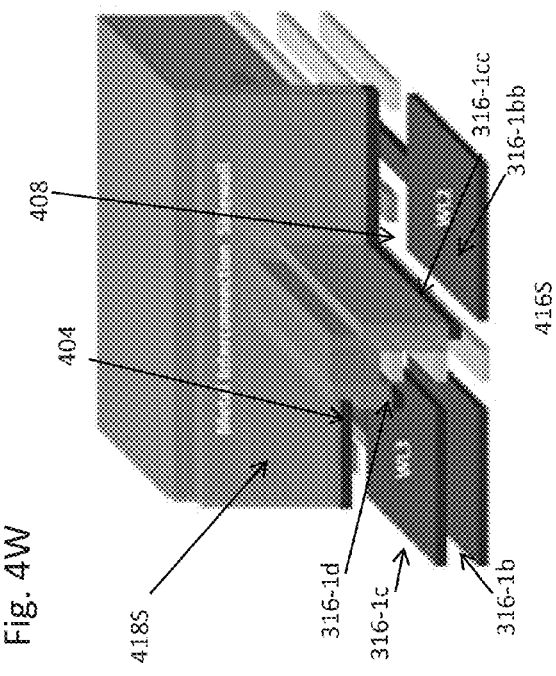
Figure 4X:
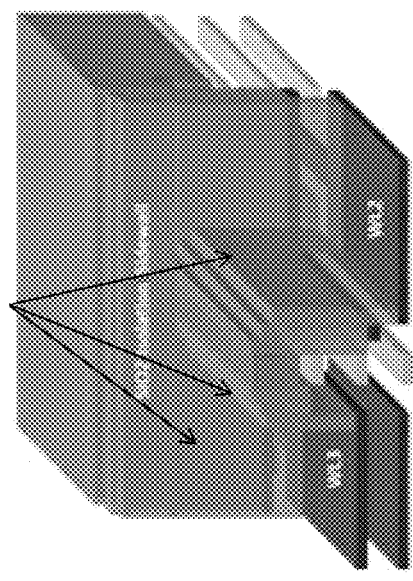

FIGS. 4A-4X illustrate a method of making an interconnect between electrodes in a three dimensional device.

While the method of making the interconnect will be described below as the method of making the word line interconnect 113 which includes the rails and the sidewall bridges for a three dimensional ReRAM device of FIGS. 3A-3F, it should be understood that the method may be used to make an interconnect for any other suitable device, such another memory device (e.g., a NAND memory device) or a non-memory device, such as a logic device. Furthermore, the interconnect does not have to connect word line portions and may be used to connect bit line portions or any other conductors.

As shown in FIG. 4A, the method includes providing the first stack 324 of electrodes 316 comprising a first electrode (e.g., contact pad) 316-1a located in the first device level, a second electrode (e.g., contact pad) 316-1b located in the second device level above the first device level, a third electrode (e.g., contact pad) 316-1c located in the third device level above the second device level, and a fourth electrode (e.g., contact pad) 316-1d located in a fourth device level above the third device level.

The method also includes providing the second stack 322 of electrodes 316 which is offset in a substantially horizontal direction (e.g., in the x-direction) from the first stack 324 of electrodes. The second stack 322 of electrodes comprises a first electrode (e.g., contact pad) 316-1aa located in the first device level, a second electrode (e.g., contact pad) 316-1bb located in the second device level above the first device level, a third electrode (e.g., contact pad) 316-1cc located in the third device level above the second device level, and a fourth electrode (e.g., contact pad) 316-1dd located in the fourth device level above the third device level. The method also includes forming an insulating fill layer 402 over the first 324 and the second 322 stacks of electrodes.

Then, as shown in FIG. 4B, a first opening 404 is formed to the fourth electrode 316d in the first stack 324 of electrodes through the insulating fill layer 402. The first opening 404 may be formed using any suitable patterning method, such as photolithography and etching through a first mask 406.

A second opening 408 is formed through the insulating fill layer 402 and through the fourth electrode 316dd to the third electrode 316cc in the second stack 322 of electrodes, as shown in FIG. 4C. The second opening 408 may be formed using any suitable patterning method, such as photolithography and etching through a second mask 410.

As shown in FIG. 4D, the center portion of the insulating fill layer 402 between the stacks 322 and 324 may then be removed to form a connecting opening 412 which connects the upper parts of the first 404 and the second 408 openings. The connecting opening 412 may be formed using any suitable patterning method, such as photolithography and etching through a third mask 414. The etching may be selective to the insulating layer 402 (e.g., silicon oxide) and may stop on the silicon nitride etch stop layer 330 located over the word line fingers 116-2, and on the exposed portions of the electrodes 316-1d and 316-1cc in the respective openings 404 and 408.

As shown in FIG. 4E, a first insulating layer 416 is formed in the first 404 and the second 408 openings. Any suitable insulating material may be used, such as silicon oxide, silicon nitride, etc. For example, the first insulating layer 416 may be a silicon oxide isolation layer located on sidewalls of the first 404 and the second 408 openings. The first insulating layer 416 is located on sidewalls and bottoms of the first, the second and the connecting openings.

Figure 4T:
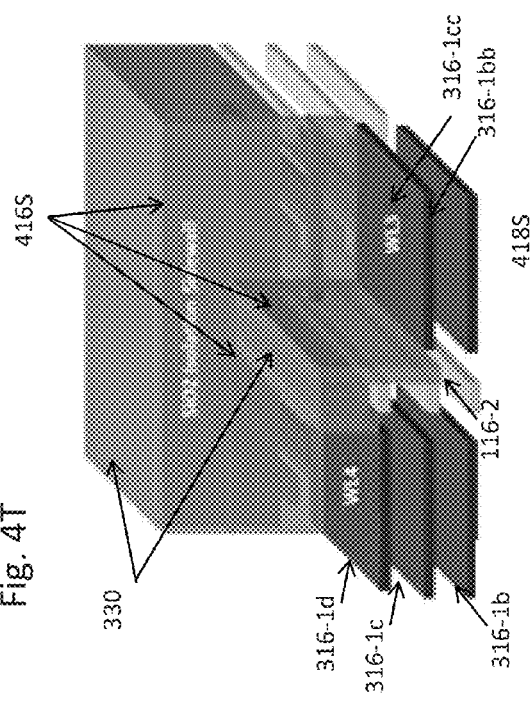

As shown in FIGS. 4F and 4T, the first insulating layer 416 may be etched using an anisotropic sidewall spacer anisotropic etch to remove layer 416 from the horizontal surfaces (e.g., from the bottoms of the first and the second openings) and to leave insulating sidewall spacers (i.e., spacer portions) 416S on the sidewalls of the openings 404 and 408. After the sidewall spacer etch, the fourth electrode 316-1d is exposed in the bottom of the first opening 404 and the third electrode 316-1cc is exposed in the bottom of the second opening 408 between the insulating sidewalls spacers 416S. FIG. 4T is a perspective view of FIG. 4F.

As shown in FIG. 4G, a first conductive layer 418 is conformally formed in the first 404, the second 408 and the connecting 412 openings such that the first conductive layer 418 is located on the first insulating layer (e.g., over the insulating spacer 416S portions of layer 416) over the sidewalls of the first, second and the connecting openings. The first conductive layer 418 may be any suitable conductive layer described above for forming the rails and bridges, such as tungsten, tungsten nitride, titanium, titanium nitride, aluminum, copper, their alloys, etc. The first conductive layer 418 electrically contacts and connects the fourth electrode 316-1d exposed in the first opening 404 and the third electrode 316-1cc exposed in the second opening 408.

Figure 4U:
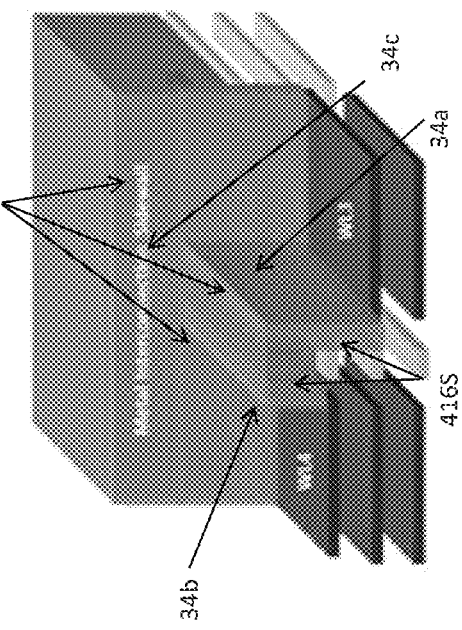

As shown in FIGS. 4H and 4U, the first conductive layer 418 may be etched using an anisotropic sidewall spacer anisotropic etch to remove layer 418 from the horizontal surfaces (i.e., from the bottoms of the first and the second openings) and to leave conductive sidewall spacers (e.g., spacer portions) 418S on the sidewalls of the openings 404, 408 and 412. Each spacer 418S forms the fifth pillar 34a portions in the second opening 408 in contact with the edge portions of the third electrode 316-1cc, sixth pillar 34b portions in the first opening 404 in contact with the edge portions of the fourth electrode 316-1d, and third bridge portions 34c in the connecting opening 412 (i.e., the spacers 418S form an interconnection between word lines levels L3 and L4 shown in FIG. 3D). After the sidewall spacer etch, the middle part of the fourth electrode 316-1d is exposed in the bottom of the first opening 404 and the middle part third electrode 316-1cc is exposed in the bottom of the second opening 408 between the conductive sidewalls spacers 418S (i.e., the between the pillar 34a, 34b portions). FIG. 4U is a perspective view of FIG. 4H.

As shown in FIGS. 4I and 4W, the first opening 404 is extended by selective anisotropic etching through the fourth electrode 316-1d and through the underlying interlayer insulating layer 117 to expose the third electrode 316-c in the first electrode stack 324 without removing the first conductive layer 418 (i.e., the first conductive spacers 418S) from over the sidewalls of the first opening 404. The second opening 408 is also extended at the same time by the selective etching through the third electrode 316-1cc to expose the second electrode 316-1bb in the second electrode stack 322 without removing the first conductive layer 418 (i.e., the first conductive spacers 418S) from over the sidewalls of the second opening 408. FIG. 4W is a perspective view of FIG. 4I.

As shown in FIG. 4J, a second insulating layer 426 (e.g., a silicon oxide layer) is formed in the first 404 and the second 408 openings such that the second insulating layer is located on sidewalls of the first, the second and the connecting openings (i.e., over the first conductive sidewall spacers 418S).

As shown in FIGS. 4K and 4X, the second insulating layer 426 may be etched using a sidewall spacer anisotropic etch to remove layer 426 from the horizontal surfaces and to leave second insulating sidewall spacers 426S on the sidewalls of the openings 404, 408 and 412 (i.e., over the first conductive sidewall spacers 418S). After the sidewall spacer etch, the third electrode 316-1c is exposed in the bottom of the first opening 404 and the second electrode 316-1bb is exposed in the bottom of the second opening 408 between the insulating sidewalls spacers 426S. FIG. 4X is a perspective view of FIG. 4K.

The steps shown in FIGS. 4T through 4X are then repeated several times to form the rest of the rails (e.g., 23a, 23b, 12a, 12b) and bridges (23c, 12c) to complete the interconnect 113-1.

As shown in FIG. 4L, a second conductive layer 428 is formed in the first 404 and the second 408 openings. The second conductive layer 428 is located on the second insulating layer 426 (e.g., on the spacers 426S) over the sidewalls of the first, the second and the connecting openings. The second conductive layer 428 electrically contacts and connects the third electrode 316-1c exposed in the first opening 404 and the second electrode 316-1bb exposed in the second opening 408.

As shown in FIG. 4M, the second conductive layer 428 may be etched using a sidewall spacer anisotropic etch to remove layer 428 from the horizontal surfaces and to leave conductive sidewall spacers 428S on the sidewalls of the openings 404, 408 and 412. Each spacer 428S forms the third pillar 23a portions in the second opening 408 in contact with the edge portions of the second electrode 316-1bb, fourth pillar 23b portions in the first opening 404 in contact with the edge portions of the third electrode 316-1c, and second bridge portions 23c in the connecting opening 412 (i.e., the spacers 428S form an interconnection between word lines levels L2 and L3 shown in FIG. 3D). After the sidewall spacer etch, the middle part of the third electrode 316-1c is exposed in the bottom of the first opening 404 and the middle part second electrode 316-1bb is exposed in the bottom of the second opening 408 between the conductive sidewalls spacers 428S (i.e., the between the pillar 23a, 23b portions).

Then, as shown in FIG. 4N, the first opening 404 is extended by selective etching through the third electrode 316-1c to expose the second electrode 316-1b in the first electrode stack 324 without removing the second conductive layer 428 (e.g., the spacers 428S) from over the sidewalls of the first opening. The second opening 408 is also extended during the same selective etch through the second electrode 316-1bb to expose the first electrode 316-aa in the second electrode stack 322 without removing the second conductive layer 428 (e.g., the spacers 428S) from over the sidewalls of the second opening.

As shown in FIG. 4O, a third insulating layer 436 is formed in the first 404 and the second 408 openings such that the third insulating layer is located on sidewalls of the first, the second and the connecting openings.

As shown in FIG. 4P, the third insulating layer 436 may be etched using a sidewall spacer anisotropic etch to remove layer 436 from the horizontal surfaces and to leave third insulating sidewall spacers 436S on the sidewalls of the openings 404, 408 and 412 (i.e., over the second conductive sidewall spacers 428S). After the sidewall spacer etch, the second electrode 316-1b is exposed in the bottom of the first opening 404 and the first electrode 316-1aa is exposed in the bottom of the second opening 408 between the insulating sidewalls spacers 436S.

As shown in FIG. 4Q, a third conductive layer 438 is formed in the first 404, the second 408 and the connecting 412 openings. The third conductive layer 438 is located on the third insulating layer 436 (e.g., the spacers 436S) over the sidewalls of the first, the second and the connecting openings. The third conductive layer 438 electrically contacts and connects the second electrode 316-1*b* exposed in the first opening 404 and the first electrode 316-1*aa* exposed in the second opening 408.

As shown in FIG. 4R, the third conductive layer 438 may be etched back to remove layer 438 from the connecting opening 412 while leaving the layer 438 to fill the remaining volume of the first 404 and the second 408 opening. The remaining portions of layer 438 form the first pillar 12*a* portions in the second opening 408 in contact with the middle portion of the first electrode 316-1*aa*, second pillar 12*b* portions in the first opening 404 in contact with the middle portion of the second electrode 316-1*b*, and first bridge 12*c* in the connecting opening 412 (i.e., layer 438 forms an interconnection between word lines levels L1 and L2 shown in FIG. 3D).

Finally, as shown in FIG. 4S, a gap fill insulating layer 440 (e.g., silicon oxide) is formed over layer 438 to fill the connecting opening 412. If desired, gap fill insulating layer may include a liner and a filler material located over the liner. The first, second, third and fourth electrodes in the first stack 324 comprise a first stack of word line fingers 116 and contact pads 316. The first, second, third and fourth electrodes in the second stack 322 comprise a second stack of word line fingers 116 and contact pads 316. The first 418, second 428 and third 438 conductive layers comprise respective first, second and third word line interconnects which connect one word line finger in one level in the first stack with a word line finger in another level in the second stack of a three dimensional device, such as a monolithic, three dimensional resistive random access (ReRAM) non-volatile memory device.

Figures 5A, 5B:
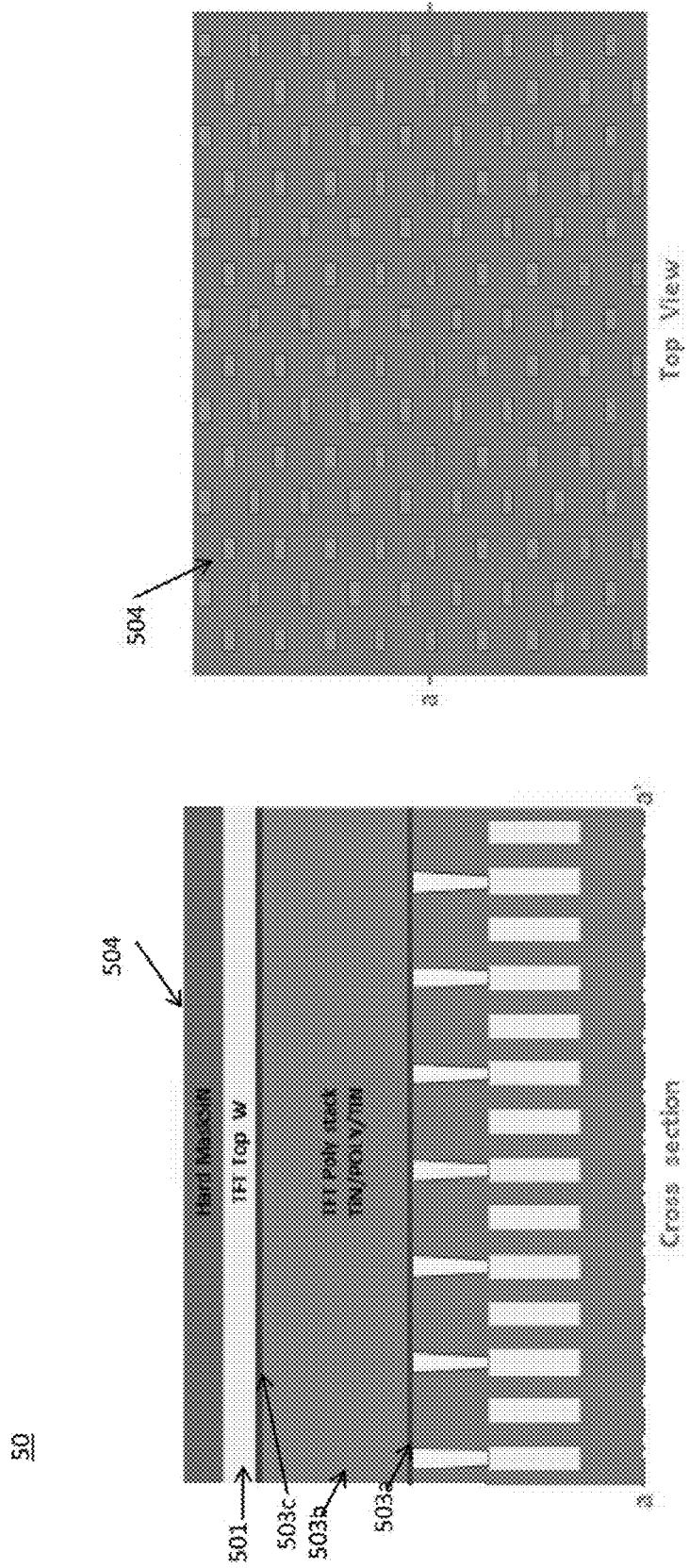

FIGS. 5A-5O show steps in a method of making a contact to a semiconductor device according to another embodiment.

While the method of making the contacts will be described below as the method of making the contacts to the select TFTs 110 of a three dimensional ReRAM device of FIGS. 1C-1D, it should be understood that the method may be used to make contacts to any other suitable device, such another memory device (e.g., a NAND memory device) or a non-memory device, such as a logic device.

Referring to FIGS. 5A and 5B, an in-process memory device is provided in step 50. The device includes the global bit lines 150 and the electrodes 151 separated by an insulating fill 500. The lines 150 and electrodes 151 may comprise any suitable conductive material, such as tungsten, tungsten nitride, titanium, titanium nitride, aluminum, copper, their alloys, etc. The insulating fill 500 may comprise any suitable insulating material, such as silicon oxide.

Step 50 includes forming a conductive layer 501 over a semiconductor containing stack 503. For example, as shown, the conductive layer 501 may be a metal (e.g., tungsten, etc.) layer formed over a stack 503 including a lower barrier layer (e.g., TiN, or WN) 503*a*, a semiconductor layer (e.g., polysilicon layer) 503*b* and an upper barrier layer (e.g., TiN or WN) 503*c*. One or both barrier layers may be omitted. In some embodiments, the metal layer 501 may be relatively thin in comparison to the semiconductor layer 503. Some embodiments may include forming a mask layer 504 over the conductive layer 501. The mask layer 504 may be a hard mask layer, such as a silicon nitride layer. FIG. 5B shows the top view of the device and FIG. 5A is a side (i.e., vertical) cross section along line a-a' in FIG. 5B.

Figure 5C:
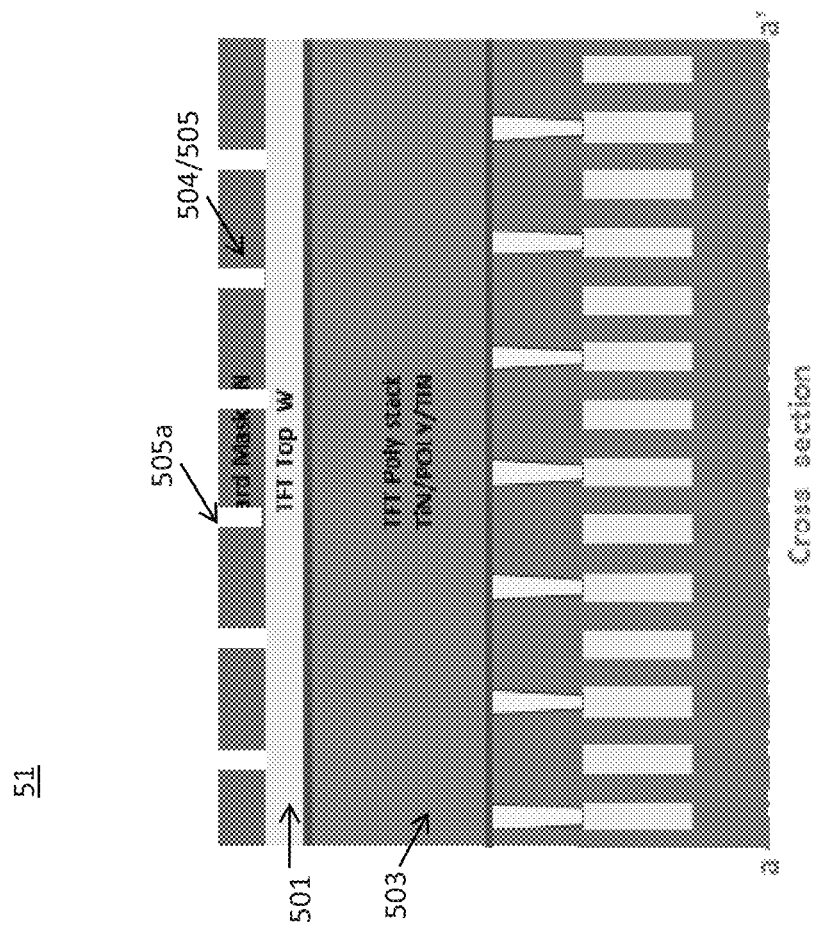

Referring to FIG. 5C, step 51 includes forming a first mask pattern (e.g., in the mask layer 504) over the conductive layer 501 (e.g., using photolithographic techniques) that exposes selected portion of the conductive layer 501. As shown, the first mask pattern 505 includes a first plurality of openings 505*a*, such as line shaped openings extending in a first horizontal direction and a second plurality of line shaped openings extending in a second horizontal direction substantially parallel to the first, such that the exposed portions are an array of rectangular exposed regions on the conductive layer 501. However, it is to be understood that other geometries for the first mask pattern may be used (e.g., exposing circular rather than rectangular regions of the conductive layer 501).

Figure 5D:
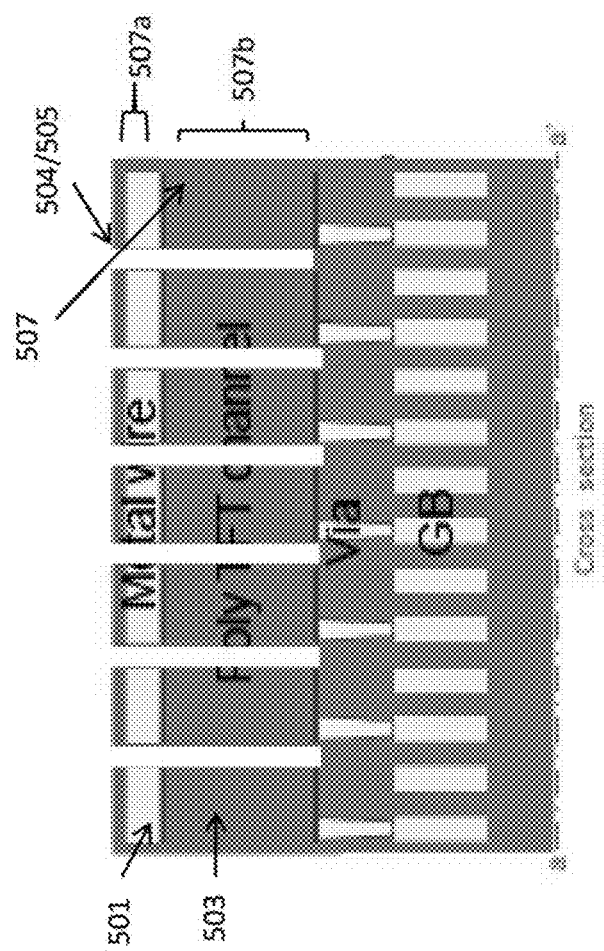

Referring to FIG. 5D, step 52 includes etching portions of the conductive layer 501 and the semiconductor containing stack 503 exposed in the first mask pattern 505 to form a plurality of pillars 507. Each pillar comprises a lower semiconductor region 507*a* (e.g., polysilicon pillar having top and bottom TiN barrier portions) and an upper conductive region 507*b*. In the example shown, plurality of pillars 507 includes an array of rectangular pillars. However, it is to be understood that other pillar shapes may be used, e.g., circular pillars.

Figures 5E, 5F:
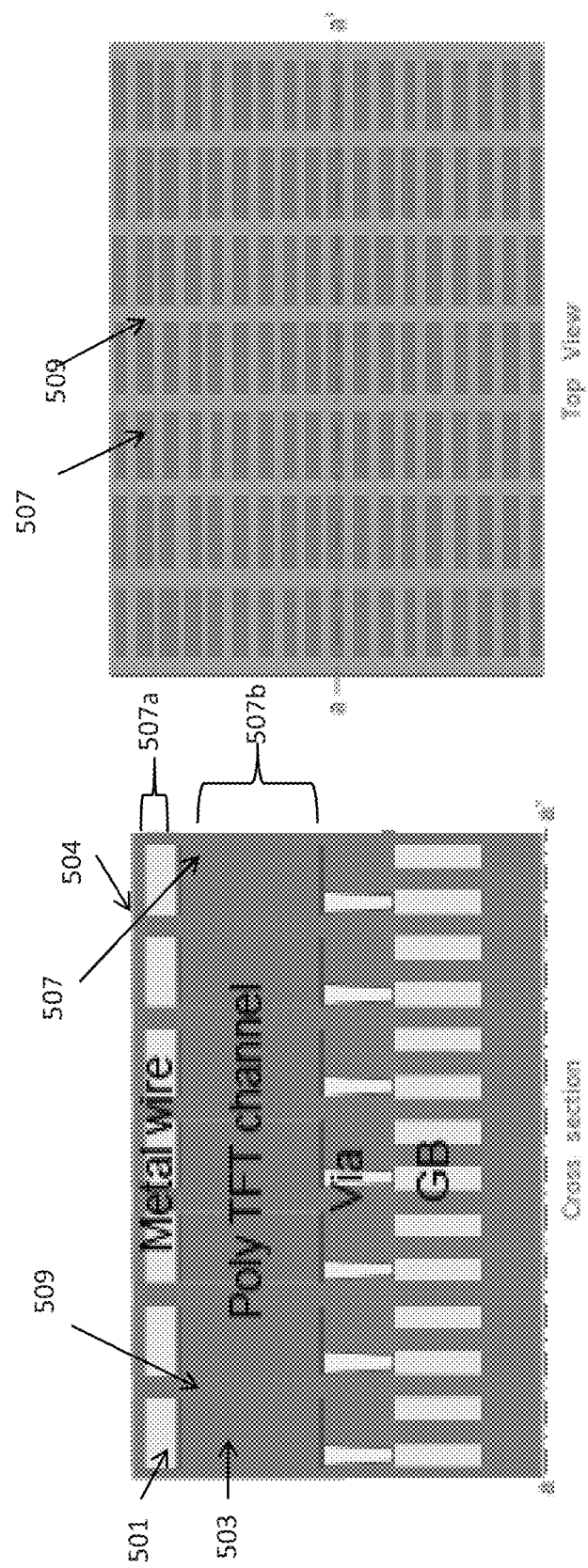

Referring to FIGS. 5E and 5F, step 53 includes forming an insulating fill layer 509 between the plurality of pillars 507. The insulating fill layer may be made of any suitable electrically insulating material, e.g., silicon oxide. In some embodiments, step 53 may further include planarizing the device (e.g., using an etch back or chemical mechanical polishing process) to form a planar surface that exposes the tops of the pillars 507 (which, in some embodiments will include a residual portion of the mask layer 504). Each region 507*b* form the channel 211 of the TFT select gate transistor 210 shown in FIGS. 1C and 1D. FIG. 5F shows the top view of the device and FIG. 5E is a side (i.e., vertical) cross section along line a-a' in FIG. 5F.

Figure 5G:
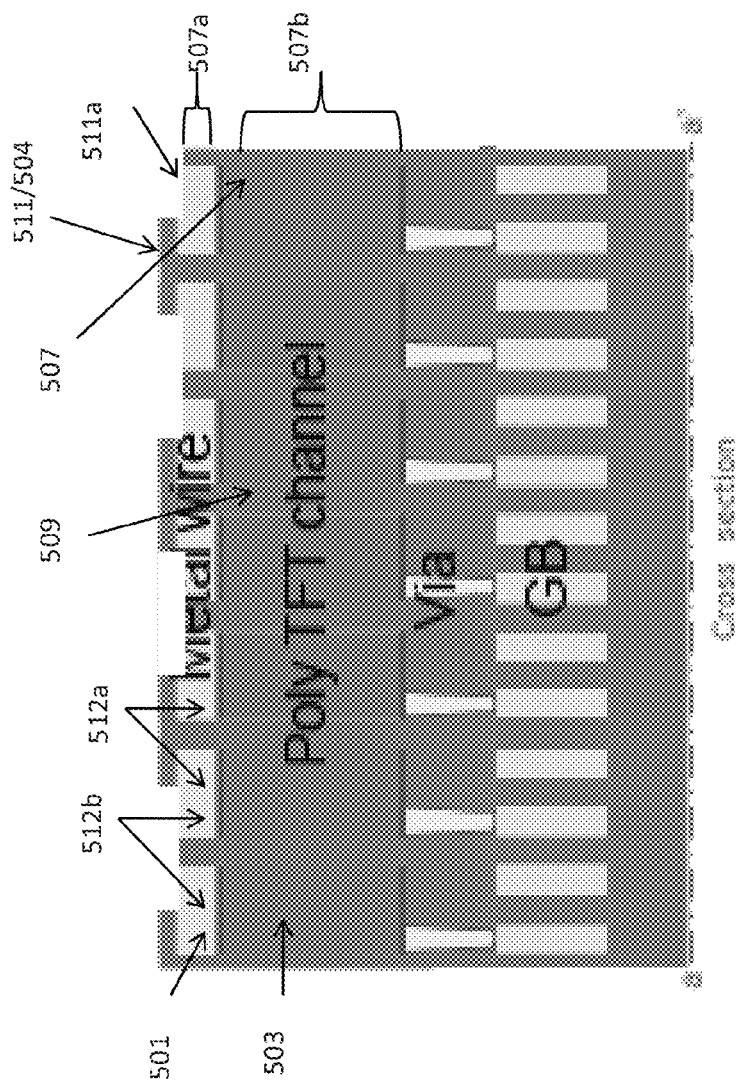

Referring to FIG. 5G, step 54 includes forming a second mask pattern 511 having openings 511*a* (e.g., using photolithographic techniques) over the plurality of pillars (e.g., in mask layer 504, or in an additional mask layer deposited over the device) and the insulating fill layer 509. The second mask pattern of 511 comprises a plurality of lines 511*b* (shown in FIG. 5I) which are offset with respect to the first mask pattern openings 505 such that the lines 511*b* of the second mask pattern 511 cover both adjacent first edge portions 512*a* of the upper conductive region 507*a* in each adjacent pair of the plurality of pillars and the insulating fill layer 509 between each adjacent pair of the plurality of pillars 507, while leaving opposing second edge portions 512*b* of the upper conductive region 507*a* in each pair of the plurality of pillars 507 uncovered.

Figures 5H, 5I:
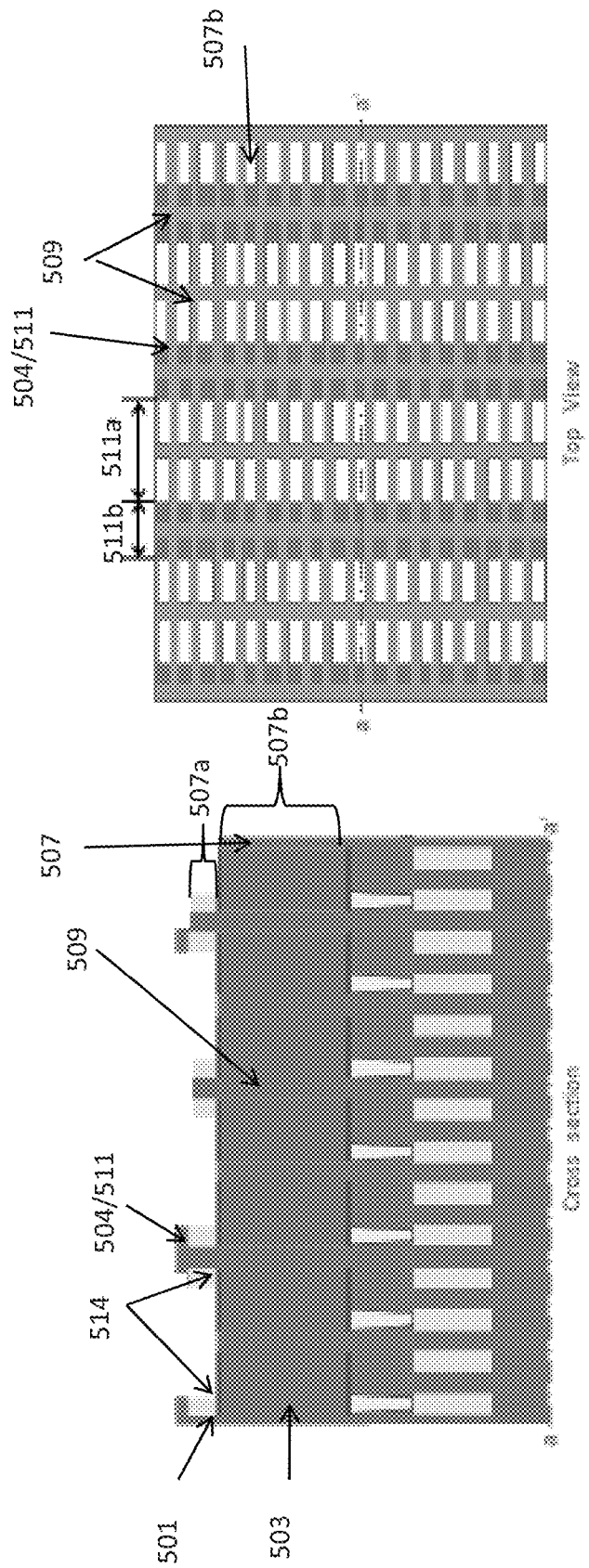

Referring to FIGS. 5H and 5I, step 55 includes etching the second edge portions 512*b* of the upper conductive regions 507*a* of each pair of the plurality of pillars 507 to leave a plurality of upper contacts 514 comprising the first edge portions 512*a* of the upper conductive regions 507*a*. Each of the plurality of upper contacts 514 is located on the respective lower semiconductor region 507*b* in each of the plurality of pillars 507. In some embodiments, each of the plurality of upper contacts 514 is narrower than the respective lower semiconductor region 507*b* of the pillar 507. In some embodiments, the use of two offset mask patterns 505 and 511 to form the upper contacts 514 may be advantageous in that the resulting the upper contacts 514 may be narrower in at least one horizontal direction than the minimum line with for the pattern forming process (e.g., photolithographic process) used to for the mask patterns. FIG. 5I shows the top view of the device and FIG. 5H is a side (i.e., vertical) cross section along line a-a' in FIG. 5I.

Figures 5J, 5K:
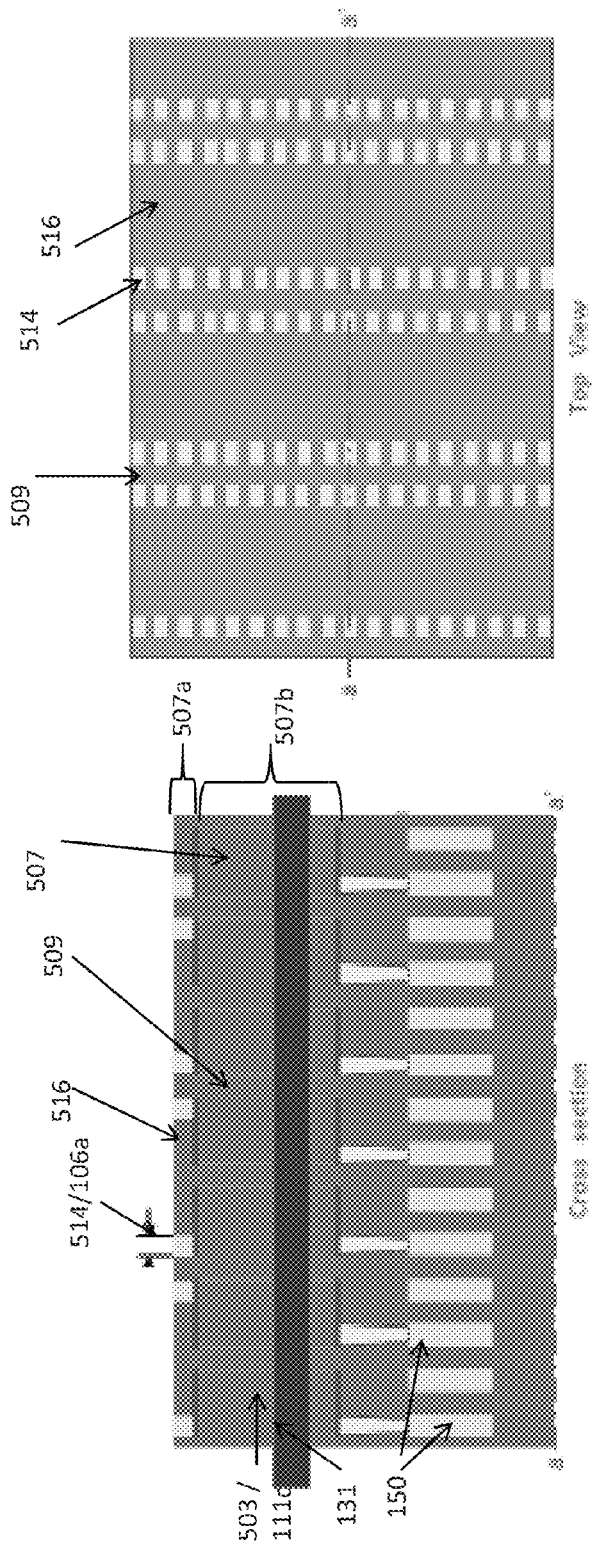

Referring to FIGS. 5J and 5K, step 56 includes covering the plurality of upper contacts 514 with an electrically insulating fill layer 516 (e.g., silicon oxide), and planarizing the fill layer to expose a horizontal surface 518 that includes portions of the upper contacts 514. Additional device layers may then be formed on the surface that use the upper contacts 514 to establish electrical connections with lower device layers.

The method described above may be used to form interconnects in monolithic, three dimensional resistive random access (ReRAM) non-volatile memory device, e.g., of the type described herein.

For example, as shown, each of the plurality of lower semiconductor regions 507*b* comprises a channel of a vertical thin film select gate transistor 110. Each select gate transistor further comprises a global bit line 150 located below the channel and a gate line 131 which is located adjacent to a side of the channel 111*c*. Source and drain regions may also be formed in the channel during the stack 503 deposition. Each of the plurality of upper contacts 514 comprises a lower portion of one of a plurality of local bit line interconnects 106*a* of the memory device. Accordingly, the memory device may have a select gate and bit line structure similar to that of the lower portion of the device 100 shown in FIGS. 1C-1D.

Figure 5M:
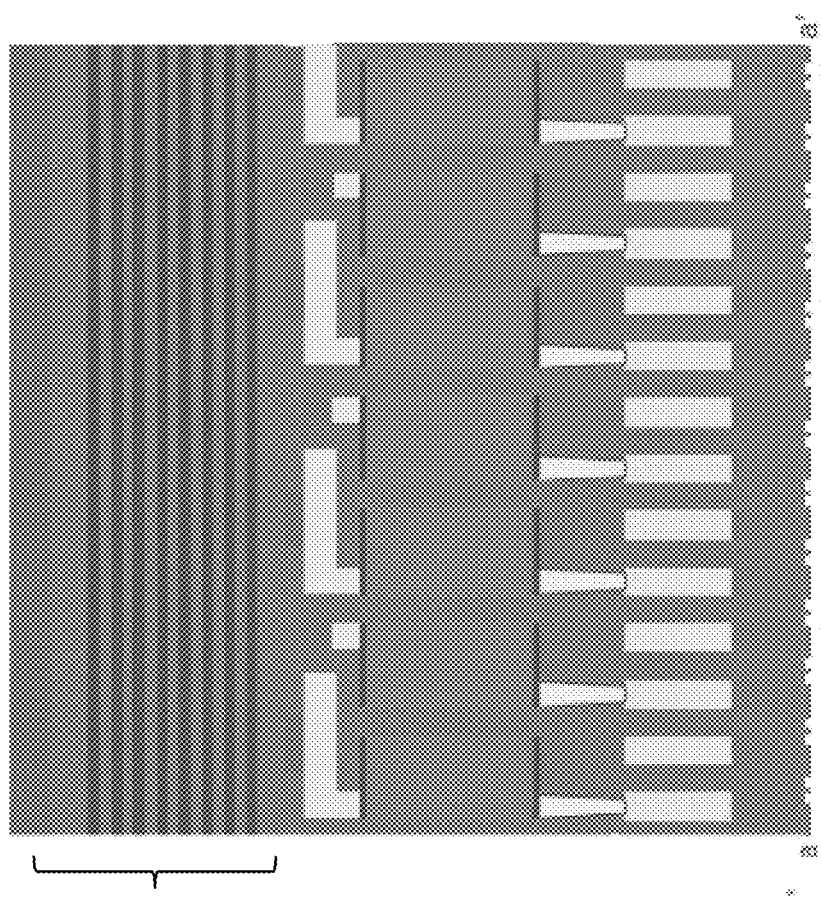
Figure 5L:
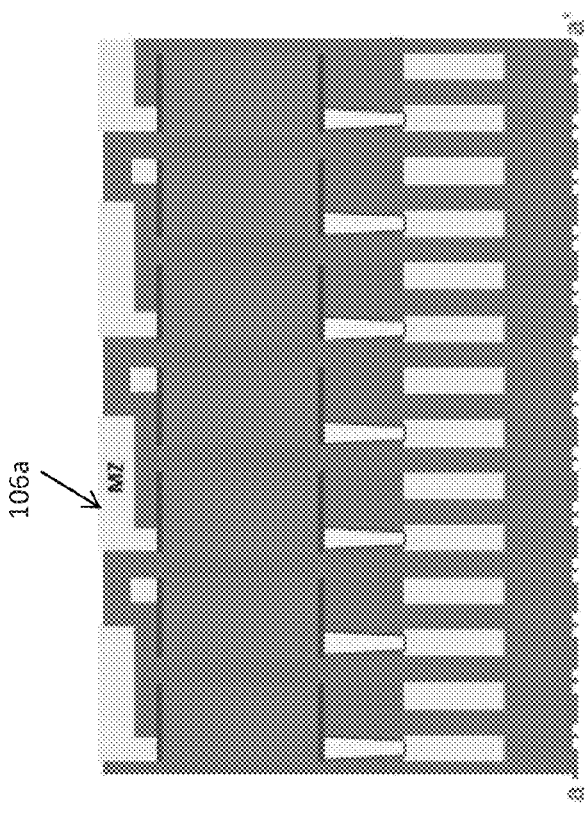

In some embodiments, the rest of the device 100 may be constructed by forming a plurality of upper potions of the local bit line interconnects over the respective lower portions of the local bit line interconnects 106*a*, as shown in FIG. 5L, and forming a memory cell region 102 over the upper portions of the plurality of local bit line interconnects 106*a*, as shown in FIG. 5M. Region 102 may include the word lines 112 separated by insulating layers 117 as shown in FIG. 1A-1C, as well as the word line interconnects 113 shown in FIGS. 3A-3F. Then, a plurality of vertically extending openings 520 are formed through the memory cell region 102 (i.e., through the word lines 112 and layers 117), as shown in FIG. 5N. Finally, the resistivity switching material 103 layers and the plurality of local bit lines 108*a*, 108*b* are formed in the openings 520 such that the plurality of local bit lines extend vertically into the memory cell region 102. The respective lines 108*a*, 108*b* are formed in contact with each of the plurality of local bit line interconnects 106*a*, 106*b* (which is formed on top of the memory cell region 102), as shown in FIG. 5O.

Although the foregoing refers to particular preferred embodiments, it will be understood that the description is not so limited. It will occur to those of ordinary skill in the art that various modifications may be made to the disclosed embodiments and that such modifications are intended to be within the scope of the description. All of the publications, patent applications and patents cited herein are incorporated herein by reference in their entirety.

What is claimed is:

1. A memory device, comprising:
   a first bit line interconnect;
   a second bit line interconnect;
   a first plurality of electrically conductive local bit lines extending in a substantially vertical direction into a memory cell region, wherein each local bit line in the first plurality of electrically conductive local bit lines is electrically connected to the first bit line interconnect;
   a second plurality of electrically conductive local bit lines extending in the substantially vertical direction into the memory cell region and horizontally offset from the first plurality of electrically conductive local bit lines, wherein each local bit line in the second plurality of electrically conductive local bit lines is electrically connected to the second bit line interconnect;
   a first select transistor electrically connected to the first bit line interconnect, wherein the first select transistor is configured to select the first plurality of electrically conductive local bit lines;
   a second select transistor electrically connected to the second bit line interconnect, wherein the second select transistor is configured to select the second plurality of electrically conductive local bit lines;
   a plurality of word lines extending in a substantially horizontal direction into the memory cell region; and
   a plurality of memory cells located in the memory cell region;
   wherein:
   the plurality of word lines comprise a first, a second, a third and a forth word line comb;
   each word line comb comprises a plurality of electrically conductive fingers;
   the plurality of electrically conductive fingers for each word line comb electrically contact other electrically conductive fingers of the same word line comb and are electrically insulated from the electrically conductive fingers of the other word line combs;
   the fingers of the first and second word line combs extend in a first substantially horizontal direction from a first interconnect region into a first side of the memory cell region;
   the fingers of the third and forth word line combs extend in a second substantially horizontal direction from a second interconnect region into a second side of the memory cell region opposite to the first side of the memory cell region; and
   the fingers of the first, second, third and forth word line comb are alternately interdigitated in the memory cell region;
   wherein a row through the memory cell region along a horizontal direction substantially perpendicular to the first and the second substantially horizontal directions comprises at least four fingers of the word line combs, at least four local bit lines, and at least eight memory cells arranged in a following order:
   a first finger of the first word line comb;
   a first memory cell;
   a first local bit line of the first plurality of electrically conductive local bit lines;
   a second memory cell;
   a first finger of the third word line comb;
   a third memory cell;
   a first local bit line of the second plurality of electrically conductive local bit lines;
   a fourth memory cell;
   a first finger of the second word line comb;
   a fifth memory cell;
   a second local bit line of the first plurality of electrically conductive local bit lines;
   a sixth memory cell;
   a first finger of the fourth word line comb;
   a seventh memory cell;
   a second local bit line of the second plurality of electrically conductive local bit lines; and
   an eighth memory cell.

2. A memory device, comprising:
   a first bit line interconnect;
   a second bit line interconnect;
   a first plurality of electrically conductive local bit lines extending in a substantially vertical direction into a memory cell region, wherein each local bit line in the first plurality of electrically conductive local bit lines is electrically connected to the first bit line interconnect;
   a second plurality of electrically conductive local bit lines extending in the substantially vertical direction into the memory cell region and horizontally offset from the first plurality of electrically conductive local bit lines, wherein each local bit line in the second plurality of electrically conductive local bit lines is electrically connected to the second bit line interconnect;
a first select transistor electrically connected to the first bit line interconnect, wherein the first select transistor is configured to select the first plurality of electrically conductive local bit lines;
a second select transistor electrically connected to the second bit line interconnect, wherein the second select transistor is configured to select the second plurality of electrically conductive local bit lines;
a plurality of word lines extending in a substantially horizontal direction into the memory cell region; and
a plurality of memory cells located in the memory cell region;
wherein:
the plurality of word lines comprise a first, a second, a third and a forth word line comb;
each word line comb comprises a plurality of electrically conductive fingers;
the plurality of electrically conductive fingers for each word line comb electrically contact other electrically conductive fingers of the same word line comb and are electrically insulated from the electrically conductive fingers of the other word line combs;
the memory device comprises a monolithic, three dimensional resistive random access (ReRAM) non-volatile memory device;
the plurality of memory cells comprise a plurality of variable resistance elements; and
each variable resistance element comprises a resistivity switching material located at an intersection of and in contact with one finger of one word line comb and one local bit line.

3. A memory device, comprising:
a first bit line interconnect;
a second bit line interconnect;
a first plurality of electrically conductive local bit lines extending in a substantially vertical direction into a memory cell region, wherein each local bit line in the first plurality of electrically conductive local bit lines is electrically connected to the first bit line interconnect;
a second plurality of electrically conductive local bit lines extending in the substantially vertical direction into the memory cell region and horizontally offset from the first plurality of electrically conductive local bit lines, wherein each local bit line in the second plurality of electrically conductive local bit lines is electrically connected to the second bit line interconnect;
a first select transistor electrically connected to the first bit line interconnect, wherein the first select transistor is configured to select the first plurality of electrically conductive local bit lines;
a second select transistor electrically connected to the second bit line interconnect, wherein the second select transistor is configured to select the second plurality of electrically conductive local bit lines;
a plurality of word lines extending in a substantially horizontal direction into the memory cell region; and
a plurality of memory cells located in the memory cell region;
wherein:
the plurality of word lines comprise a first, a second, a third and a forth word line comb;
each word line comb comprises a plurality of electrically conductive fingers;
the plurality of electrically conductive fingers for each word line comb electrically contact other electrically conductive fingers of the same word line comb and are electrically insulated from the electrically conductive fingers of the other word line combs;
the first bit line interconnect is located below memory cell region;
the second bit line interconnect is located above the memory cell region;
the first plurality of electrically conductive local bit lines extend into the memory cell region from below;
a second plurality of electrically conductive local bit lines extend into the memory cell region from above;
the first bit line interconnect electrically connected to the first plurality of electrically conductive local bit lines comprises a first bit line comb;
the second bit line interconnect electrically connected to the second plurality of electrically conductive local bit lines comprises a second bit line comb;
an electrically conductive local bit line in the first bit line comb is interdigitated between two electrically conductive local bit lines in the second bit line comb; and
an electrically conductive local bit line in the second bit line comb is interdigitated between two electrically conductive local bit lines in the first bit line comb.

4. The device of claim 3, further comprising a first global bit line and a second global bit line.

5. The device of claim 4, wherein:
the first select transistor comprises a first vertical thin film transistor having an upper source or drain region of a first conductivity type located above a channel region of a second conductivity type, a lower drain or source region of the first conductivity type located below the channel region, and a first gate electrode located adjacent to the channel region;
the second select transistor comprises a second vertical thin film transistor having an upper a source or drain region of the first conductivity type located above a channel region of the second conductivity type, a lower drain or source region of the first conductivity type located below the channel region, and a second gate electrode located adjacent to the channel region;
the upper source or drain region of the first select transistor is electrically connected to the first bit line interconnect;
the lower drain or source region of the first select transistor is electrically connected to the first global bit line which is located below the first select transistor;
the upper source or drain region of the second select transistor is electrically connected to the second bit line interconnect; and
the lower drain or source region of the second select transistor is electrically connected to the second global bit line which is located below the second select transistor.

6. The device of claim 5, wherein:
the first and the second global bit lines each comprise elongated electrically conductive lines extending in a direction substantially parallel to the fingers of the word line combs;
the first and the second gate electrodes comprise first and second portions of a first select gate line located adjacent to the respective first and second select transistor; and
the first select gate line comprises an elongated electrically conductive line extending in a substantially horizontal direction substantially perpendicular to the first and the second global bit lines and to the fingers of the word lines combs.

7. The device of claim 6, further comprising:
a third select transistor which comprises a third vertical thin film transistor;

a fourth select transistor which comprises a fourth vertical thin film transistor;
a third global bit line located between the first and the second global bit line;
a fourth global bit line located adjacent to the second global bit line;
a second select gate line; and
a third select gate line.

8. The device of claim 7, wherein:
the first, the second, the third and the fourth global bit lines extend substantially parallel to each other in a substantially horizontal direction in the memory cell region;
the first, the second and the third select gate lines extend substantially parallel to each other in a substantially horizontal direction substantially perpendicular to the first, the second, the third and the fourth global bit lines;
the first select transistor is located above the first and the third global bit lines and between the first and the second select gate lines;
the second select transistor is located above the second and the fourth global bit lines and between the first and the second select gate lines;
the third select transistor is located above the first and the third global bit lines and between the second and the third select gate lines; and
the fourth select transistor is located above the second and the fourth global bit lines and between the second and the third select gate lines.

9. The device of claim 8, wherein:
a width of the first select transistor is about 3F in a direction substantially parallel to the first and second select gate lines, where F is a minimum feature size in a semiconductor process;
a period between a corresponding point in the first and the second transistors is about 4F in a direction substantially parallel to the first and the second select gate lines;
a period between a corresponding point in the first and the third transistors is about 2F in a direction substantially perpendicular to the first and the second select gate lines;
an area of a select transistor module containing one of the first, second, third and fourth select transistor is about 8F; and
an area of a memory cell module located over the select transistor module is about $4F^2$.

10. The device of claim 4, wherein:
the first select transistor comprises a first planar transistor having a channel region of a second conductivity type located in a horizontal plane between source and drain regions of the first conductivity type, and a first gate electrode located adjacent to the channel region;
the second select transistor comprises a second planar transistor having a channel region of a second conductivity type located a horizontal plane between source and drain regions of the first conductivity type, and a second gate electrode located adjacent to the channel region;
the drain region of the first select transistor is electrically connected to the first bit line interconnect;
the source region of the first select transistor is electrically connected to a source line;
the first gate electrode is connected to or comprises a portion of the first global bit line;
the drain region of the second select transistor is electrically connected to the second bit line interconnect;
the source region of the second select transistor is electrically connected to the source line; and
the second gate electrode is connected to or comprises a portion of the second global bit line.

11. The device of claim 10, wherein:
the first gate electrode comprises a portion of the first global bit line;
the first global bit line extends in a first horizontal direction over the first planar transistor and an imaginary straight line between the source and the drain of the first planar transistor extends in a second horizontal direction at an angle of 20 to 70 degrees with respect to the first horizontal direction;
the second gate electrode comprises a portion of the second global bit line;
the second global bit line extends in the first horizontal direction over the second planar transistor and an imaginary straight line between the source and the drain of the second planar transistor extends in a second horizontal direction at an angle of 20 to 70 degrees with respect to the first horizontal direction; and
the source line extends in a third horizontal direction which is substantially perpendicular to the first horizontal direction.

12. A memory device, comprising:
a memory cell region;
a plurality of memory cells located in the memory cell region;
a plurality of word lines extending in a substantially horizontal direction into the memory cell region; and
a plurality of bit lines extending in a substantially vertical direction into the memory cell region;
wherein:
the plurality of word lines comprise a first, second, third and forth word line comb;
each word line comb comprises a plurality of electrically conductive fingers;
the plurality of electrically conductive fingers for each word line comb electrically contact other electrically conductive fingers of the same word line comb and are electrically insulated from the electrically conductive fingers of the other word line combs;
the fingers of the first and second word line combs extend in a first substantially horizontal direction from a first interconnect region into a first side of the memory cell region;
the fingers of the third and forth word line combs extend in a second substantially horizontal direction from a second interconnect region into a second side of the memory cell region opposite to the first side of the memory cell region; and
the fingers of the first, second, third and forth word line comb are alternately interdigitated in the memory cell region.

13. The device of claim 12, wherein:
word line finger spacing in the memory cell region is about 1° F.;
the first substantially horizontal direction extends an angle of about 180 degrees with respect to the second horizontal direction;
the memory device comprises a monolithic, three dimensional resistive random access (ReRAM) non-volatile memory device;
the plurality of memory cells comprise a plurality of variable resistance elements; and
each variable resistance element comprises a resistivity switching material located at an intersection of and in contact with one finger of one word line comb and one bit line.

14. The device of claim 13, wherein each of the first, second, third and fourth word line combs comprises:

a first finger located in a first device level, a second finger located in a second device level above the first device level, a third finger located in a third device level above the second device level, and a fourth finger located in a fourth device level above the third device level, wherein the first, second, third and fourth fingers are offset from each other in a horizontal direction; and a word line interconnect which electrically connects the first, second, third and fourth finger, wherein the word line interconnect is located outside the memory cell region.

15. The device of claim 14, wherein the word line interconnect comprises:

a first conductive vertical rail which extends in the first or the second horizontal direction and contacts a contact pad of the first finger in the first device level;

a second conductive vertical rail which extends in the first or the second horizontal direction and contacts a contact pad of the second finger in the second device level;

a first conductive sidewall bridge which extends in a third horizontal direction substantially perpendicular to the first and the second horizontal directions, and which contacts both the first and the second conductive vertical rails;

a third conductive vertical rail which extends in the first or the second horizontal direction and contacts a contact pad of the second finger in the second device level;

a fourth conductive vertical rail which extends in the first or the second horizontal direction and contacts a contact pad of the third finger in the third device level;

a second conductive sidewall bridge which extends in a third horizontal direction substantially perpendicular to the first and the second horizontal directions, and which contacts both the third and the fourth conductive vertical rails;

a fifth conductive vertical rail which extends in the first or the second horizontal direction and contacts a contact pad of the third finger in the third device level;

a sixth conductive vertical rail which extends in the first or the second horizontal direction and contacts a contact pad of the fourth finger in the fourth device level; and a third conductive sidewall bridge which extends in a third horizontal direction substantially perpendicular to the first and the second horizontal directions, and which contacts both the fifth and the sixth conductive vertical rails.

16. The device of claim 12, further comprising a first bit line interconnect, a second bit line interconnect, a first select transistor and a second select transistor.

17. The device of claim 16, wherein:

the plurality of bit lines comprise a first plurality of electrically conductive local bit lines extending in a substantially vertical direction into a memory cell region, and a second plurality of electrically conductive local bit lines extending in the substantially vertical direction into the memory cell region and horizontally offset from the first plurality of electrically conductive local bit lines;

each local bit line in the first plurality of electrically conductive local bit lines is electrically connected to the first bit line interconnect;

each local bit line in the second plurality of electrically conductive local bit lines is electrically connected to the second bit line interconnect;

the first bit line interconnect electrically connected to the first plurality of electrically conductive local bit lines comprises a first bit line comb;

the second bit line interconnect electrically connected to the second plurality of electrically conductive local bit lines comprises a second bit line comb;

an electrically conductive local bit line in the first bit line comb is interdigitated between two electrically conductive local bit lines in the second bit line comb;

an electrically conductive local bit line in the second bit line comb is interdigitated between two electrically conductive local bit lines in the first bit line comb; and the first select transistor is electrically connected to the first bit line interconnect, wherein the first select transistor is configured to select the first plurality of electrically conductive local bit lines; and the second select transistor is electrically connected to the second bit line interconnect, wherein the second select transistor is configured to select the second plurality of electrically conductive local bit lines.

18. A method of making an interconnect between electrodes in a three dimensional device, comprising:

providing a first stack of electrodes comprising a first electrode located in a first device level, a second electrode located in a second device level above the first device level, a third electrode located in a third device level above the second device level, and a fourth electrode located in a fourth device level above the third device level;

providing a second stack of electrodes which is offset in a substantially horizontal direction from the first stack of electrodes, the second stack of electrodes comprising a first electrode located in the first device level, a second electrode located in the second device level above the first device level, a third electrode located in the third device level above the second device level, and a fourth electrode located in the fourth device level above the third device level;

forming an insulating fill layer over the first and the second stacks of electrodes;

forming a first opening to the fourth electrode in the first stack of electrodes through the insulating fill layer;

forming a second opening through the insulating fill layer and through the fourth electrode to the third electrode in the second stack of electrodes;

forming a first insulating layer in the first and the second openings such that the first insulating layer is located on sidewalls of the first and the second openings and such that the fourth electrode is exposed in the first opening and the third electrode is exposed in the second opening;

forming a first conductive layer in the first and the second openings such that the first conductive layer is located on the first insulating layer over the sidewalls of the first and second openings and such that the first conductive layer electrically contacts and connects the fourth electrode exposed in the first opening and the third electrode exposed in the second opening;

extending the first opening through the fourth electrode to expose the third electrode in the first electrode stack without removing the first conductive layer from over the sidewalls of the first opening;

extending the second opening through the third electrode to expose the second electrode in the second electrode stack without removing the first conductive layer from over the sidewalls of the second opening;

forming a second insulating layer in the first and the second openings such that the second insulating layer is located on sidewalls of the first and the second openings and such that the third electrode is exposed in the first opening and the second electrode is exposed in the second opening;

forming a second conductive layer in the first and the second openings such that the second conductive layer is located on the second insulating layer over the sidewalls of the first and second openings and such that the second conductive layer electrically contacts and connects the third electrode exposed in the first opening and the second electrode exposed in the second opening;

extending the first opening through the third electrode to expose the second electrode in the first electrode stack without removing the second conductive layer from over the sidewalls of the first opening;

extending the second opening through the second electrode to expose the first electrode in the second electrode stack without removing the second conductive layer from over the sidewalls of the second opening;

forming a third insulating layer in the first and the second openings such that the third insulating layer is located on sidewalls of the first and the second openings and such that the second electrode is exposed in the first opening and the first electrode is exposed in the second opening; and forming a third conductive layer in the first and the second openings such that the third conductive layer is located on the third insulating layer over the sidewalls of the first and second openings and such that the third conductive layer electrically contacts and connects the second electrode exposed in the first opening and the first electrode exposed in the second opening.

19. The method of claim 18, wherein the step of forming the first insulating layer in the first and the second openings comprises:

forming the first insulating layer in the first and the second openings such that the first insulating layer is located on sidewalls and bottoms of the first and the second openings; and performing an anisotropic sidewall spacer etch to remove the first insulating layer from the bottoms of the first and the second openings and to leave sidewall spacer portions of the first insulating layer on sidewalls of the first and the second openings such that the fourth electrode is exposed in the first opening and the third electrode is exposed in the second opening.

20. The method of claim 19, wherein the step of extending the first opening through the fourth electrode and extending the second opening through the third electrode comprises:

performing an anisotropic sidewall spacer etch to remove the first conductive layer from the bottoms of the first and the second openings and to leave sidewall spacer portions of the first conductive layer over sidewalls of the first and the second openings; and selectively anisotropically etching the first opening through the fourth electrode and selectively anisotropically etching the second opening through the third electrode without removing the sidewall spacer portions of the first conductive layer from over the sidewalls of the first and the second opening.

21. The method of claim 18, wherein:

the first, second, third and fourth electrodes in the first stack comprise a first stack of word line fingers and contact pads;

the first, second, third and fourth electrodes in the second stack comprise a second stack of word line fingers and contact pads;

the first, second and third conductive layers comprise respective first, second and third word line interconnects which connect one word line finger in one level in the first stack with a word line finger in another level in the second stack; and the three dimensional device comprises a monolithic, three dimensional resistive random access (ReRAM) non-volatile memory device.

22. The method of claim 21, wherein:

the first word line interconnect comprises:
 a first conductive vertical rail which extends in the first or the second horizontal direction and contacts a contact pad of the first finger in the first device level;
 a second conductive vertical rail which extends in the first or the second horizontal direction and contacts a contact pad of the second finger in the second device level; and
 a first conductive sidewall bridge which extends in a third horizontal direction substantially perpendicular to the first and the second horizontal directions, and which contacts both the first and the second conductive vertical rails;

the second word line interconnect comprises:
 a third conductive vertical rail which extends in the first or the second horizontal direction and contacts a contact pad of the second finger in the second device level;
 a fourth conductive vertical rail which extends in the first or the second horizontal direction and contacts a contact pad of the third finger in the third device level; and
 a second conductive sidewall bridge which extends in a third horizontal direction substantially perpendicular to the first and the second horizontal directions, and which contacts both the third and the fourth conductive vertical rails; and the third word line interconnect comprises:
 a fifth conductive vertical rail which extends in the first or the second horizontal direction and contacts a contact pad of the third finger in the third device level;
 a sixth conductive vertical rail which extends in the first or the second horizontal direction and contacts a contact pad of the fourth finger in the fourth device level; and
 a third conductive sidewall bridge which extends in a third horizontal direction substantially perpendicular to the first and the second horizontal directions, and which contacts both the fifth and the sixth conductive vertical rails.

23. A method of making a contact to a semiconductor device, comprising:

forming a conductive layer over a semiconductor layer;

forming a first mask pattern over the conductive layer;

etching portions of the conductive layer and the semiconductor layer exposed in the first mask pattern to form a plurality of pillars, wherein each pillar comprises a lower semiconductor region and an upper conductive region;

forming an insulating fill layer between the plurality of pillars;

forming a second mask pattern over the plurality of pillars and the insulating fill layer, wherein the second mask pattern is offset with respect to the first mask pattern such that the second mask pattern covers both adjacent first edge portions of the upper conductive region in each adjacent pair of the plurality of pillars and the insulating fill layer between each adjacent pair of the plurality of pillars, while leaving opposing second edge portions of the upper conductive region in each pair of the plurality of pillars uncovered;

etching the second edge portions of the upper conductive regions of each pair of the plurality of pillars to leave a plurality of upper contacts comprising the first edge portions of the upper conductive regions, wherein each of the plurality of upper contacts is located on the respective lower semiconductor region in each of the plurality of pillars.

24. The method of claim 23, wherein each of the plurality of upper contacts is narrower than the respective lower semiconductor region.

25. The method of claim 23, wherein:
the semiconductor device comprises a monolithic, three dimensional resistive random access (ReRAM) non-volatile memory device;
each of the plurality of lower semiconductor regions comprises a channel of a vertical thin film select gate transistor;
each select gate transistor further comprises a global bit line located below the channel and a gate electrode located adjacent to a side of the channel; and
each of the plurality of upper contacts comprises a lower portion of one of a plurality of local bit line interconnects of the semiconductor device.

26. The method of claim 25, further comprising:
forming a plurality of upper potions of the local bit line interconnects over the respective lower portions of the local bit line interconnects;
forming a plurality of local bit lines in contact with each of the plurality of local bit line interconnects; and
forming a memory cell region over the upper portions of the plurality of local bit line interconnects, such that the plurality of local bit lines extend vertically into the memory cell region.

27. A semiconductor device, comprising:
a first, second, third and fourth transistors, each transistor having a channel region of a second conductivity type located in a horizontal plane between source region and first drain region of a first conductivity type, wherein:
the second transistor is located adjacent to the first transistor in a first horizontal direction in the horizontal plane, such that a first channel edge containing the source region of the first transistor faces a second channel edge containing the source region of the second transistor;
the third transistor is located adjacent to the first transistor in a second horizontal direction in the horizontal plane, such that a third channel edge containing the first drain region of the first transistor faces a fourth channel edge containing the first drain region of the third transistor;
the fourth transistor is located adjacent to the second transistor in the second horizontal direction in the horizontal plane, such that a third channel edge containing the first drain region of the second transistor faces a fourth channel edge containing the first drain region of the fourth transistor;
the fourth transistor is located adjacent to adjacent to the third transistor in the first horizontal direction in the horizontal plane, such that a first channel edge containing the source region of the third transistor faces a second channel edge containing the source region of the fourth transistor;
the first channel edge of each transistor is located opposite the second channel edge of each transistor;
the third channel edge of each transistor is located opposite the fourth channel edge of each transistor;
the second horizontal direction is substantially perpendicular to the first horizontal direction; and
the source region of each transistor is offset in both the first and the second directions with respect to the first drain region of each transistor;
a common source line which extends in the second direction between the first and the second transistors and between the third and the fourth transistors, and which is electrically connected to the source regions of each of the first, second, third and fourth transistors;
a first common gate electrode which extends in the first direction over the channel regions between respective source regions and first drain regions of the first and the second transistors; and
a second common gate electrode which extends in the first direction over the channel regions between respective source regions and first drain regions of the third and the fourth transistors.

28. The device of claim 27, further comprising:
a second drain region located in a fourth channel edge of the first transistor;
a second drain region located in a fourth channel edge of the second transistor;
a second drain region located in a third channel edge of the third transistor;
a second drain region located in a third channel edge of the fourth transistor;
a third common gate electrode which extends in the first direction over the channel regions between respective source regions and second drain regions of the first and the second transistors; and
a fourth common gate electrode which extends in the first direction over the channel regions between respective source regions and second drain regions of the third and the fourth transistors.

29. The device of claim 28, wherein:
the first, second, third and fourth transistors comprise select transistors for a monolithic, three dimensional resistive random access (ReRAM) non-volatile memory device;
a memory cell region of the (ReRAM) non-volatile memory device is located above the select transistors;
the first drain region of the respective first, second, third and fourth select transistor is electrically connected to a respective first, second, third and fourth lower bit line interconnect;
the second drain region of the respective first, second, third and fourth select transistor is electrically connected to a respective first, second, third and fourth upper bit line interconnect;
the first, second, third and fourth lower bit line interconnects are located below memory cell region;
the first, second, third and fourth upper bit line interconnects are located above the memory cell region;
the first common gate electrode is connected to or comprises a portion of the first global bit line;
the second common gate electrode is connected to or comprises a portion of the second global bit line;
the third common gate electrode is connected to or comprises a portion of the third global bit line; and
the fourth common gate electrode is connected to or comprises a portion of the fourth global bit line.

30. The device of claim 29, further comprising:
a first plurality of electrically conductive local bit lines which are located in a first vertical plane and which extend into the memory cell region from below and which are electrically connected to the first lower bit line interconnect;

a second plurality of electrically conductive local bit lines which are located in a second vertical plane and which extend into the memory cell region from below and which are electrically connected to the second lower bit line interconnect;

a third plurality of electrically conductive local bit lines which are located in a third vertical plane and which extend into the memory cell region from below and which are electrically connected to the third lower bit line interconnect;

a fourth plurality of electrically conductive local bit lines which are located in a fourth vertical plane and which extend into the memory cell region from below and which are electrically connected to the fourth lower bit line interconnect;

a fifth plurality of electrically conductive local bit lines which are interdigitated with the second plurality of electrically conductive local bit lines in the second vertical plane, and which extend into the memory cell region from above and which are electrically connected to the first upper bit line interconnect;

a sixth plurality of electrically conductive local bit lines which are interdigitated with the first plurality of electrically conductive local bit lines in the first vertical plane, and which extend into the memory cell region from above and which are electrically connected to the second upper bit line interconnect;

a seventh plurality of electrically conductive local bit lines which are interdigitated with the third plurality of electrically conductive local bit lines in the third vertical plane, and which extend into the memory cell region from above and which are electrically connected to the third upper bit line interconnect; and an eighth plurality of electrically conductive local bit lines which are interdigitated with the fourth plurality of electrically conductive local bit lines in the fourth vertical plane, and which extend into the memory cell region from above and which are electrically connected to the fourth upper bit line interconnect.

* * * * *